(12) United States Patent
Na et al.

(10) Patent No.: US 9,897,650 B2
(45) Date of Patent: Feb. 20, 2018

(54) INTEGRATED CIRCUIT AND STORAGE DEVICE INCLUDING INTEGRATED CIRCUIT

(71) Applicant: Samsung Electronics Co., Ltd., Suwon-si, Gyeonggi-do (KR)

(72) Inventors: Daehoon Na, Hwasung (KR); ChaeHoon Kim, Hwaseong-si (KR); HyunJin Kim, Hwaseong-si (KR); Jangwoo Lee, Cheonan-si (KR); Jeongdon Ihm, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/957,987

(22) Filed: Dec. 3, 2015

(65) Prior Publication Data

US 2016/0216319 A1     Jul. 28, 2016

(30) Foreign Application Priority Data

Jan. 22, 2015  (KR) .................. 10-2015-0010609

(51) Int. Cl.
  *G01R 31/28*    (2006.01)
  *G01R 31/3177*  (2006.01)
  *G01R 31/317*   (2006.01)

(52) U.S. Cl.
  CPC ... *G01R 31/31716* (2013.01); *G01R 31/2884* (2013.01); *G01R 31/3177* (2013.01)

(58) Field of Classification Search
  CPC .......... G01R 31/2884; G01R 31/31716; G01R 31/3177
  See application file for complete search history.

(56) References Cited

U.S. PATENT DOCUMENTS

| 5,467,369 A | * | 11/1995 | Vijeh | ..................... H03K 5/023 |
| | | | | 370/249 |
| 7,049,839 B1 | * | 5/2006 | Hsiao | ................. G01R 31/3187 |
| | | | | 324/750.3 |
| 7,313,740 B2 | | 12/2007 | Ong | |
| 7,546,506 B2 | | 6/2009 | Sonoda et al. | |

(Continued)

FOREIGN PATENT DOCUMENTS

| JP | 2008-537999 A | 10/2008 |
| KR | 10-0183924 B1 | 5/1999 |

(Continued)

*Primary Examiner* — Kyle Vallecillo
(74) *Attorney, Agent, or Firm* — Harness, Dickey & Pierce, P.L.C.

(57) ABSTRACT

An integrated circuit including first pads and second pads, a first receiver circuit and a first driver circuit respectively connected to the first pad, a second receiver circuit and a second driver circuit respectively connected to the second pad, and a first loopback circuit having a first input terminal electrically connected to the first receiver circuit, a first output terminal electrically connected to the first driver circuit, a second output terminal electrically connected to the second driver circuit, and a second input terminal electrically connected to the second receiver circuit may be provided. At a normal mode, the first loopback circuit electrically connects the first input terminal to the second output terminal and electrically connects the second input terminal to the first output terminal. At a test mode, the first loopback circuit electrically connects the first input terminal to the first output terminal.

19 Claims, 23 Drawing Sheets

(56) References Cited

U.S. PATENT DOCUMENTS

| | | |
|---|---|---|
| 7,586,955 B2 | 9/2009 | Iizuka |
| 7,679,133 B2 | 3/2010 | Son et al. |
| 7,983,112 B2 | 7/2011 | Haraguchi et al. |
| 8,553,466 B2 | 10/2013 | Han et al. |
| 8,559,235 B2 | 10/2013 | Yoon et al. |
| 8,559,492 B2 * | 10/2013 | Shin .................... H04L 25/0272 375/224 |
| 8,654,587 B2 | 2/2014 | Yoon et al. |
| 9,500,700 B1 * | 11/2016 | Wang .................. G01R 31/2851 |
| 2002/0021468 A1 * | 2/2002 | Kato .................... H04B 10/299 398/135 |
| 2004/0267479 A1 * | 12/2004 | Querbach ........ G01R 31/31716 702/117 |
| 2005/0286616 A1 * | 12/2005 | Kodavati ............... H04B 17/14 375/219 |
| 2006/0059397 A1 * | 3/2006 | Brox ................ G01R 31/31716 714/736 |
| 2008/0205170 A1 * | 8/2008 | Ikeda ..................... G11C 29/02 365/193 |
| 2010/0251042 A1 * | 9/2010 | Selking .................. G11C 29/02 714/719 |
| 2011/0084722 A1 | 4/2011 | Nishioka |
| 2011/0233648 A1 | 9/2011 | Seol et al. |
| 2014/0029364 A1 | 1/2014 | Bhakta et al. |
| 2014/0063942 A1 | 3/2014 | Jeddeloh |
| 2014/0212131 A1 | 7/2014 | Zhang |
| 2014/0253099 A1 | 9/2014 | Han et al. |
| 2015/0364173 A1 | 12/2015 | Kim et al. |
| 2016/0084903 A1 * | 3/2016 | Melamed-Kohen ............. G01R 31/31716 324/750.3 |

FOREIGN PATENT DOCUMENTS

| | | |
|---|---|---|
| KR | 10-0190921 B1 | 6/1999 |
| KR | 10-2015-0143943 A | 12/2015 |

* cited by examiner

INTEGRATED CIRCUIT AND STORAGE DEVICE INCLUDING INTEGRATED CIRCUIT

CROSS-REFERENCE TO RELATED APPLICATIONS

A claim for priority under 35 U.S.C. § 119 is made to Korean Patent Application No. 10-2015-0010609 filed Jan. 22, 2015, in the Korean Intellectual Property Office, the entire contents of which are hereby incorporated by reference.

BACKGROUND

Some example embodiments of the inventive concepts described herein relate to electronic devices, and more particularly, relate to integrated circuits and/or storage devices including the integrated circuit.

A storage device may be a device that stores data according to a control of a host device, for example, a computer, a smart phone, and a smart pad. The storage device may contain a device (e.g., a hard disk drive) which stores data on a magnetic disk, or a semiconductor memory (e.g., a solid state drive (SSD) or memory card). In particular, the storage device may be a device which stores data on a nonvolatile memory.

The storage device may include one or more integrated circuits. For example, the storage device may contain a plurality of nonvolatile memory integrated circuits and a memory controller integrated circuit.

After manufacture, the storage device may be tested to check whether to operate normally. Because the storage device includes a plurality of integrated circuits, a device and a method capable of testing each of integrated circuits of the storage device efficiently are desired.

SUMMARY

Some example embodiments of the inventive concepts provide an integrated circuit and a storage device including the same, capable of supporting an improved test method.

According to an example embodiment, an integrated circuit includes first pads and second pads, a first receiver circuit and a first driver circuit respectively connected to the first pads, a second receiver circuit and a second driver circuit respectively connected to the second pads, and a first loopback circuit having a first input terminal electrically connected to the first receiver circuit, a first output terminal electrically connected to the first driver circuit, a second output terminal electrically connected to the second driver circuit, and a second input terminal electrically connected to the second receiver circuit. At a normal mode, the first loopback circuit may be configured to electrically connect the first input terminal to the second output terminal and electrically connect the second input terminal to the first output terminal. At a test mode, the first loopback circuit may be configured to electrically connect the first input terminal to the first output terminal.

According to an example embodiment, a storage device includes a plurality of nonvolatile memory chips, a memory controller configured to control the plurality of nonvolatile memories, and an integrated circuit connected between the plurality of nonvolatile memories and the memory controller and configured to adjust timing of a signal exchanged between the plurality of nonvolatile memories and the memory controller. At a normal mode, the integrated circuit may transfer a signal received from the memory controller to the plurality of nonvolatile memories, and at a test mode, the integrated circuit may feed at least a portion of a signal received from the memory controller back to the memory controller.

According to an example embodiment, an integrated circuit includes one or more interface circuits connected to one or more groups of nonvolatile memories, respectively. The one or more interface circuit may be configured to arbitrate a communication between the one or more groups of nonvolatile memories and the test circuits.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
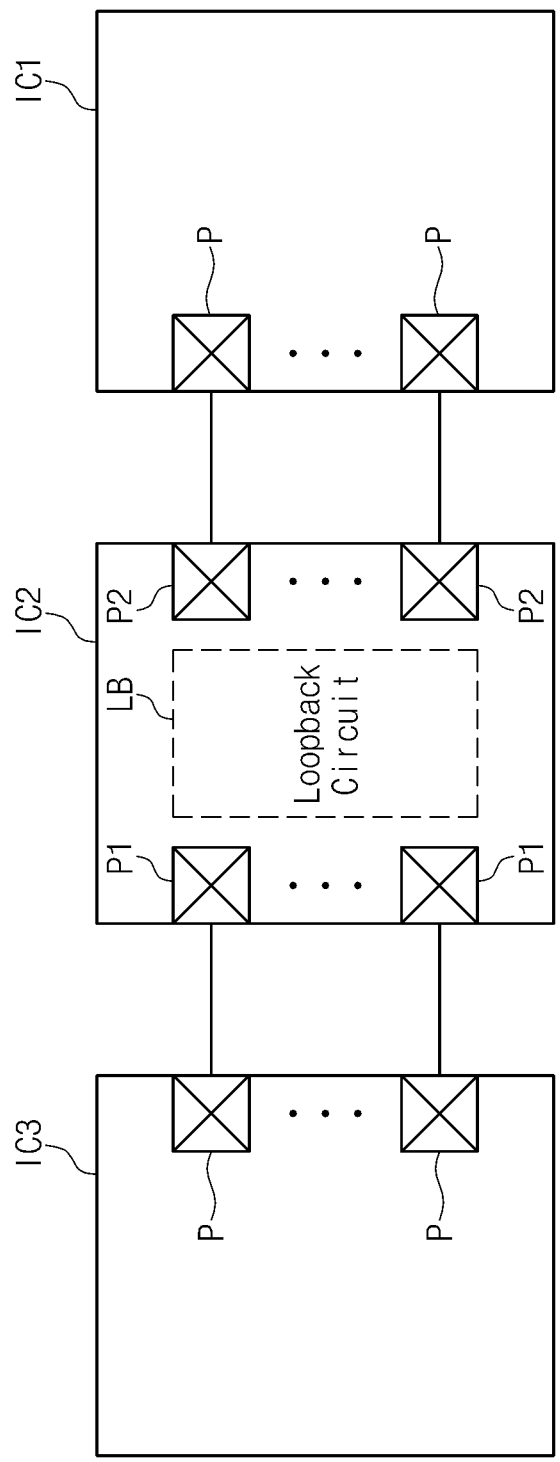
FIG. 1 is a block diagram schematically illustrating integrated circuits according to an example embodiment of the inventive concepts.

Various example embodiments of the inventive concepts will be described in detail with reference to the accompanying drawings. The inventive concepts, however, may be embodied in various different forms, and should not be construed as being limited only to the illustrated example embodiments. Rather, these example embodiments are provided as examples so that this disclosure will be thorough and complete, and will fully convey the inventive concepts to those skilled in the art. Accordingly, known processes, elements, and techniques are not described with respect to some of the example embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular example embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Meanwhile, when it is possible to implement any example embodiment in any other way, a function or an operation specified in a specific block may be performed differently from a flow specified in a flowchart. For example, two consecutive blocks may actually perform the function or the operation simultaneously, and the two blocks may perform the function or the operation conversely according to a related operation or function.

Unless otherwise defined, all terms (including technical and scientific terms) used herein have the same meaning as commonly understood by one of ordinary skill in the art to which this inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In the description below, it will be understood that when an element such as a layer, region, substrate, plate, or member is referred to as being "on" another element, it can be directly on the other element or intervening elements may be present. In contrast, the term "directly" means that there are no intervening elements.

FIG. 1 is a block diagram schematically illustrating integrated circuits IC1, IC2, and IC3 according to an example embodiment of the inventive concepts. Referring to FIG. 1, a first integrated circuit IC1 may be connected to a second integrated circuit IC2 through a plurality of pads P on the first integrated circuit IC3. The first integrated circuit IC1 may include a flash memory, a phase-change RAM (PRAM), a magnetic RAM (MRAM), a ferroelectric RAM (FeRAM), a resistive RAM (RRAM), or the like.

The integrated circuit IC2 may be configured to communicate with the first integrated circuit IC1 through a plurality of second pads P2. The second integrated circuit IC2 may be configured to communicate with the third integrated circuit IC3 through a plurality of first pads P1. The second integrated circuit IC2 may include an interface circuit that arbitrates communication between the first integrated circuit IC1 and the third integrated circuit IC3. The second integrated circuit IC2 may adjust or retime synchronization about signals and/or clocks exchanged between the first integrated circuit IC1 and the third integrated circuit IC3.

The third integrated circuit IC3 may be configured to communicate with the second integrated circuit IC2 through the plurality of pads P on the third integrated circuit IC3. The third integrated circuit IC3 may be configured to test the first integrated circuit IC1 and the second integrated circuit IC2 independently or together. In example embodiments, the third integrated circuit IC3 may include a memory controller. In other example embodiments, the third integrated circuit IC3 may include a test device configured to test the first and second integrated circuits IC1 and IC2.

The second integrated circuit IC2 may contain a loopback circuit LB. At a normal mode, the loopback circuit LB may be inactivated. At this time, the second integrated circuit IC2 may arbitrate communication between the first integrated circuit IC1 and the third integrated circuit IC3. For example, the second integrated circuit IC2 may adjust timing of signals transferred from the third integrated circuit IC3 through the first pads P1 and may transfer the adjusted or retimed signals to the first integrated circuit IC1 through the second pads P2. The second integrated circuit IC2 may adjust or retime signals transferred from the first integrated circuit IC1 through the second pads P2 and may transfer the adjusted or retimed signals to the third integrated circuit IC3 through the first pads P1.

At a test mode, the loopback circuit LB may be activated. At this time, the second integrated circuit IC2 may transfer a part or all of signals received from the third integrated circuit IC3 through at least one of the first pads P1 to the third integrated circuit IC3 through at least one of the first pads P1.

That is, at the normal mode where the loopback circuit LB is inactivated, the third integrated circuit IC3 may test the first and second integrated circuits IC1 and IC2 together. At the test mode where the loopback circuit LB is activated, the third integrated circuit IC3 may exclude the first integrated circuit IC1 from being tested and may test the second integrated circuit IC2 alone.

Figure 2:
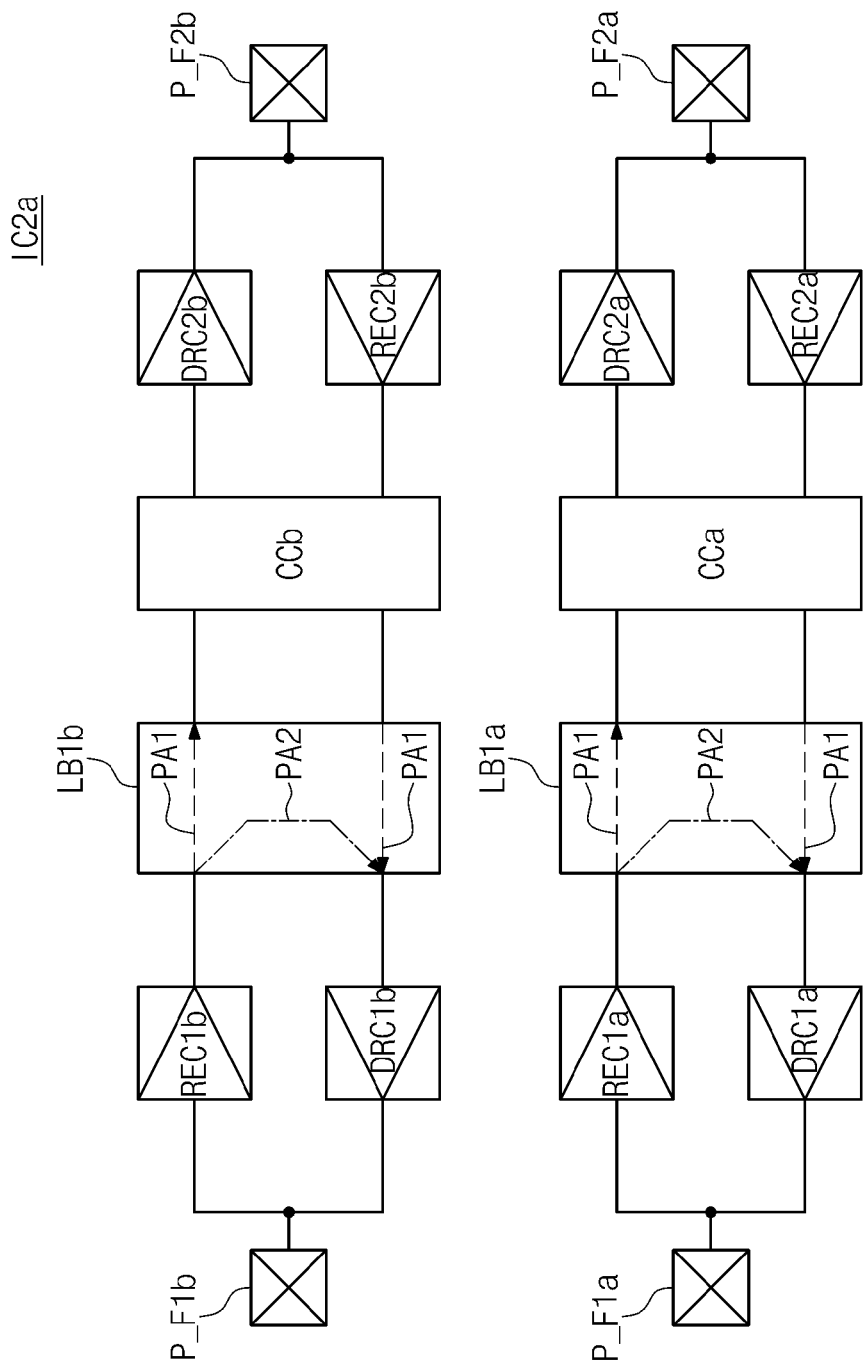
FIG. 2 is a block diagram schematically illustrating a second integrated circuit, from among the integrated circuits illustrated in FIG. 1, according to an example embodiment of the inventive concepts.

FIG. 2 is a block diagram schematically illustrating an example of the second integrated circuit IC2 (e.g., second integrated circuit IC2a), from among the integrated circuits illustrated in FIG. 1, according to an example embodiment of the inventive concepts. Referring to FIGS. 1 and 2, a second integrated circuit IC2a may contain pads P_F1a, P_F1b, P_F2a, and P_F2b, receiver circuits REC1a, REC1b, REC2a, and REC2b, driver circuits DRC1a, DRC1b, DRC2a, and DRC2b, loopback circuits LB1a and LB1b, and internal circuits CCa and CCb.

The receiver circuit REC1a and the driver circuit DRC1a may be connected to the pad P_F1a. The receiver circuit REC1a may receive a signal transferred from the third integrated circuit IC3 through the pad P_F1a by detecting a voltage variation of the pad P_F1a. The driver circuit DRC1a may transfer a signal to the third integrated circuit IC3 through the pad P_F1a by driving a voltage of the pad P_F1a.

The receiver circuit REC2a and the driver circuit DRC2a may be connected to the pad P_F2a. The receiver circuit REC2a may receive a signal transferred through the pad P_F2a by detecting a voltage variation of the pad P_F2a.

The driver circuit DRC2a may transfer a signal to the first integrated circuit IC1 through the pad P_F2a by driving a voltage of the pad P_F2a.

The internal circuit CCa may be connected between the receiver circuit REC1a and the driver circuit DRC2a and may process a signal transferred from the third integrated circuit IC3 to the first integrated circuit IC1. For example, the internal circuit CCa may adjust or retime a signal transferred to the driver circuit DRC2a from the receiver circuit REC1a.

Furthermore, the internal circuit CCa may be connected between the receiver circuit REC2a and the driver circuit DRC1a and may process a signal transferred from the first integrated circuit IC1 to the third integrated circuit IC3. For example, the internal circuit CCa may adjust or retime a signal transferred to the driver circuit DRC1a from the receiver circuit REC2a.

A loopback circuit LB1a may be connected between the receiver circuit REC1a and the internal circuit CCa and between the driver circuit DRC1a and the internal circuit CCa. The loopback circuit LB1a may be inactivated at a normal mode and may be activated at a test mode.

The loopback circuit LB1a may have a first input electrically connected to the receiver circuit REC1a, a first output electrically connected to the driver circuit DRC1a, a second output electrically connected to the driver circuit DRC2a through the internal circuit CCa, and a second input electrically connected to the receiver circuit REC2a through the internal circuit CCa.

In some example embodiments, at the normal mode, the loopback circuit LB1a may be inactivated and a signal path in the loopback circuit LB1a may be formed along a first path PA1 marked by a dotted line. That is, at the normal mode, the loopback circuit LB1a may electrically connect the first input corresponding to the receiver circuit REC1a with the second output corresponding to the driver circuit DRC2a. Furthermore, at the normal mode, the loopback circuit LB1a may electrically connect the first output corresponding to the driver circuit DRC1a with the second input corresponding to the receiver circuit REC2a. That is, at the normal mode, the loopback circuit LB1a may transfer a signal transferred from the third integrated circuit IC3 to the first integrated circuit IC1 and may transfer a signal transferred from the first integrated circuit IC1 to the third integrated circuit IC3.

In some example embodiments, at the test mode, the loopback circuit LB1a may be activated and a signal path in the loopback circuit LB1a may be formed along a second path PA2 marked by an alternate long and short dash lines. That is, at the test mode, the loopback circuit LB1a may electrically connect the first input corresponding to the receiver circuit REC1a with the first output corresponding to the driver circuit DRC1a. That is, at the test mode, the loopback circuit LB1a may feed a signal transferred from the third integrated circuit IC3 back to the third integrated circuit IC3.

When the loopback circuit LB1a is implemented, it may be possible to test signal transfer characteristics of the pad P_F1a, the receiver circuit REC1a, and the driver circuit DRC1a of the second integrated circuit IC2a alone at the test mode.

The receiver circuit REC1b and the driver circuit DRC1b may be connected to the pad P_F1b. The receiver circuit REC1b may receive a signal transferred from the third integrated circuit IC3 through the pad P_F1b by detecting a voltage variation of the pad P_F1b. The driver circuit DRC1b may transfer a signal to the third integrated circuit IC3 through the pad P_F1b by driving a voltage of the pad P_F1b.

The receiver circuit REC2b and the driver circuit DRC2b may be connected to the pad P_F2b. The receiver circuit REC2b may receive a signal transferred from the first integrated circuit IC1 through the pad P_F2b by detecting a voltage variation of the pad P_F2b. The driver circuit DRC2b may transfer a signal to the first integrated circuit IC1 through the pad P_F2b by driving a voltage of the pad P_F2b.

The internal circuit CCb may be connected between the receiver circuit REC1b and the driver circuit DRC2b and may process a signal transferred from the third integrated circuit IC3 to the first integrated circuit IC1. For example, the internal circuit CCb may adjust or retime a signal transferred to the driver circuit DRC2b from the receiver circuit REC1b.

Furthermore, the internal circuit CCb may be connected between the receiver circuit REC2b and the driver circuit DRC1b and may process a signal transferred from the first integrated circuit IC1 to the third integrated circuit IC3. For example, the internal circuit CCb may adjust or retime a signal transferred to the driver circuit DRC1b from the receiver circuit REC2b.

The loopback circuit LB1b may operate in the same manner as the loopback circuit LB1a. When the loopback circuit LB1b is implemented, it may be possible to test signal transfer characteristics of the pad P_F1b, the receiver circuit REC1b, and the driver circuit DRC1b of the second integrated circuit IC2b alone at the test mode.

In sum, the loopback circuit LB1 may be provided at the second integrated circuit IC2a. At the test mode, the loopback circuit LB1 may feed a signal received through a pad connected to the third integrated circuit IC3 back to the third integrated circuit IC3 through the same pad, thereby supporting a test about a signal path between the third integrated circuit IC3 and the loopback circuit LB1. For example, at the test mode, the loopback circuit LB1 may support a self-loopback test. At the test mode, the signal path PA1 supported by the loopback circuit LB1 may be a self-loopback signal path.

In some example embodiments, the loopback circuit LB1 may enter a normal mode or a test mode according to a command or a control signal received from the third integrated circuit IC3. In example embodiments, the loopback circuit LB1 may be respectively implemented with respect to some or all of the first pads on the second integrated circuit IC3 that connect the second and third integrated circuits IC2 and IC3.

Figure 3:
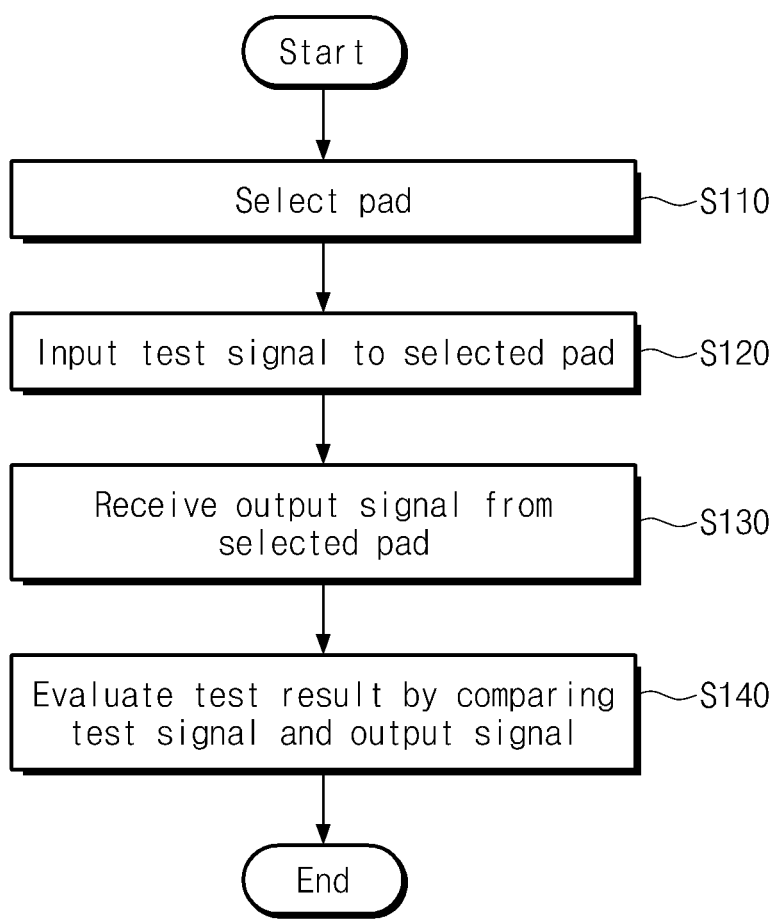
FIG. 3 is a flow chart schematically illustrating a method for testing a second integrated circuit illustrated in FIG. 1.

FIG. 3 is a flow chart schematically illustrating a method for testing a second integrated circuit IC2 illustrated in FIG. 1. An example method in which a third integrated circuit IC3 tests a second integrated circuit IC2 is illustrated in FIG. 3.

Referring to FIGS. 1 and 3, in step S110, a pad from among the first pads P1 may be selected. For example, a to-be-tested pad of the first pads P1 of the second integrated circuit IC2 may be selected. For example, one of the first pads P1 or some of first pads P1 may be selected.

In step S120, a test signal may be provided to the selected pad(s). In the case where one first pad P1 is selected, the test signal may be provided to the selected first pad P1. In the case where a plurality of first pad P1 is selected, test signals may be simultaneously or sequentially provided to the plurality of first pad P1 selected. The test signal may be a signal that swings between a high level and a low level periodically or has a desired (or alternatively, predetermined) pattern.

In step S130, an output signal may be received from the selected pad. A loopback circuit LB1 of the second integrated circuit IC2 may support a self-loopback test described with reference to FIG. 2. Accordingly an output from the one or some of the first pads P1 to which the test signal is provided may be received.

In step S140, a test result may be evaluated (or measured) by comparing the test signal and the output signal.

Figure 4:
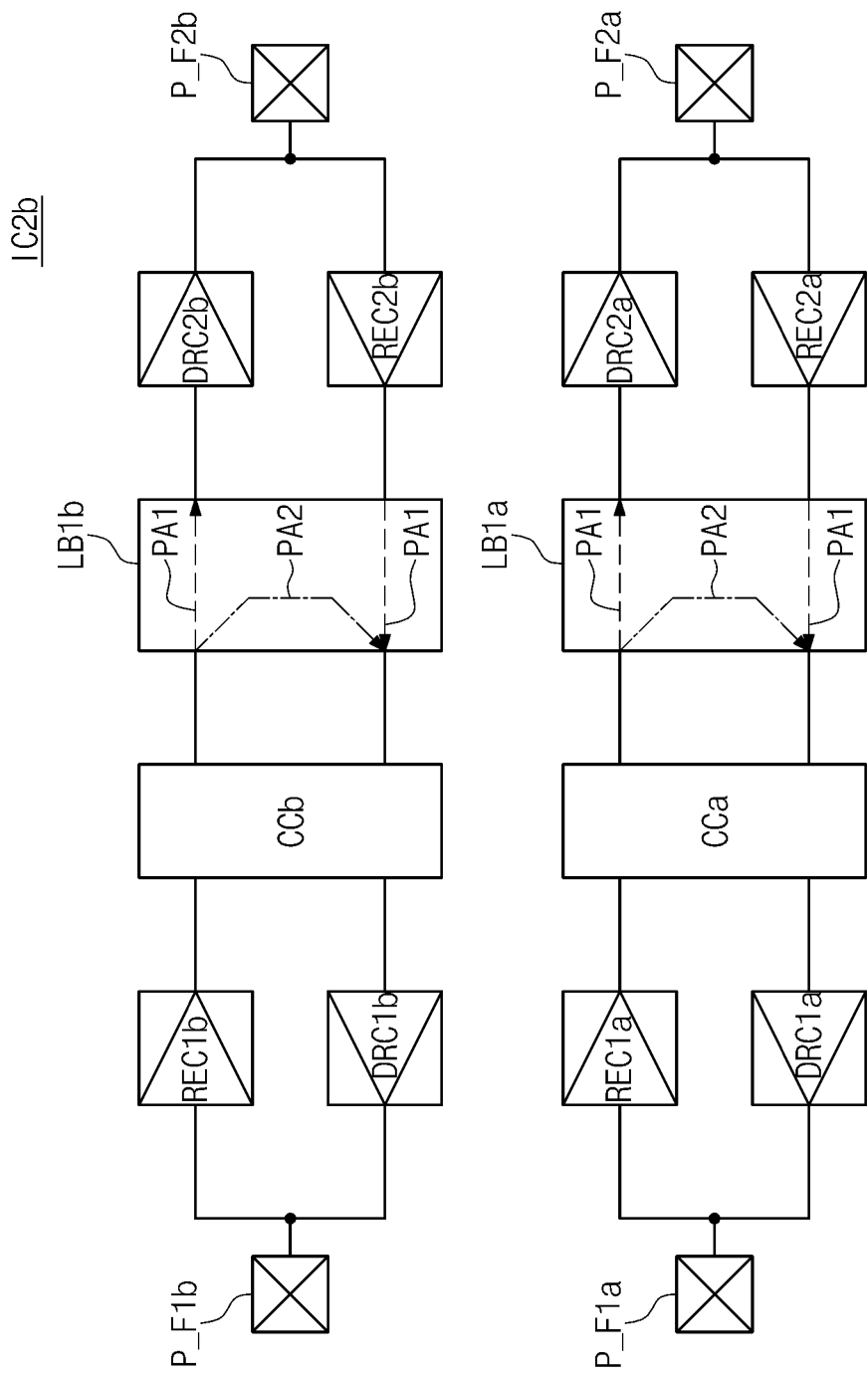
FIG. 4 is a block diagram schematically illustrating a second integrated circuit according to an example embodiment of the inventive concepts.

FIG. 4 is a block diagram schematically illustrating a second integrated circuit IC2b according to an example embodiment of the inventive concepts. Referring to FIGS. 1 and 4, a second integrated circuit IC2b may include pads P_F1a, P_F1b, P_F2a, and P_F2b, receiver circuits REC1a, REC1b, REC2a, and REC2b, driver circuits DRC1a, DRC1b, DRC2a, and DRC2b, and loopback circuits LB1a and LB1b, and internal circuits CCa and CCb.

The second integrated circuit IC2b may be different from a second integrated circuit IC2a illustrated in FIG. 2 in that the loopback circuit LB1a is provided between the internal circuit CCa and the driver circuit DRC2a and between the internal circuit CCa and the receiver circuit REC2a and in that the loopback circuit LB1b is provided between the internal circuit CCb and the driver circuit DRC2b and between the internal circuit CCb and the receiver circuit REC2b.

According to the second integrated circuit IC2b illustrated in FIG. 4, it may be possible to test signal transfer characteristics of the pad P_F1a, the receiver circuit REC1a, the internal circuit CCa, and the driver circuit DRC1a of the second integrated circuit IC2b alone at a test mode. Furthermore, it may be possible to test signal transfer characteristics of the pad P_F1b, the receiver circuit REC1b, the internal circuit CCb, and the driver circuit DRC1b of the second integrated circuit IC2b alone at the test mode. That is, the loopback circuits LB1a and LB1b may support a self-loopback test.

Figure 5:
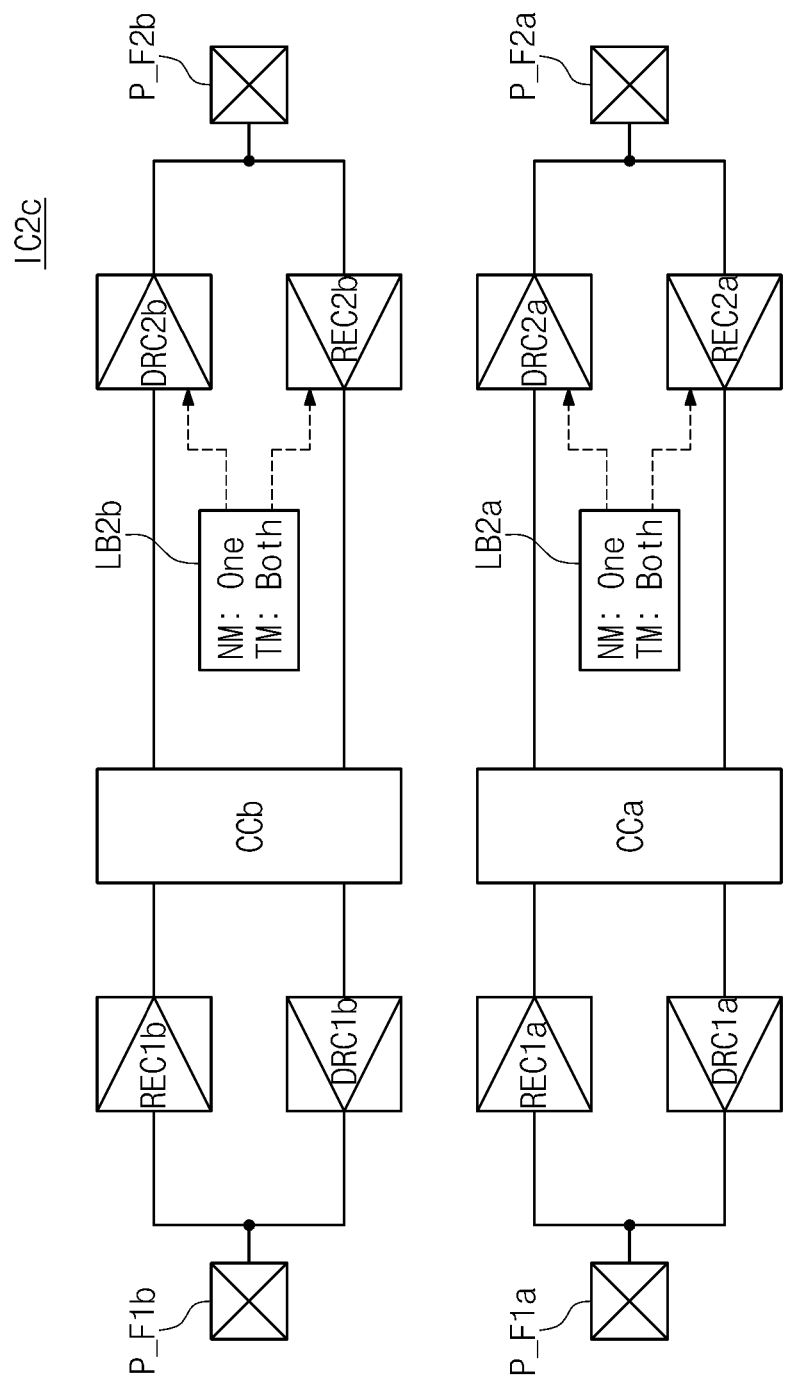
FIG. 5 is a block diagram schematically illustrating a second integrated circuit according to an example embodiment of the inventive concepts.

FIG. 5 is a block diagram schematically illustrating a second integrated circuit IC2c according to an example embodiment of the inventive concepts. Referring to FIGS. 1 and 5, a second integrated circuit IC2c may contain pads P_F1a, P_F1b, P_F2a, and P_F2b, receiver circuits REC1a, REC1b, REC2a, and REC2b, driver circuits DRC1a, DRC1b, DRC2a, and DRC2b, and loopback circuits LB2a and LB2b, and internal circuits CCa and CCb.

The second integrated circuit IC2c may be different from second integrated circuits IC2a and IC2b illustrated in FIGS. 2 and 4 in that the loopback circuit LB is not provided on a signal path of the second integrated circuit IC2c. Instead, the loopback circuit LB2a may be configured to control the driver circuit DRC2a and the receiver circuit REC2a.

At a normal mode NM, under a control of the loopback circuit LB2a, one of the driver circuit DRC2a and the receiver circuit REC2a may be activated, while the other thereof may be inactivated. For example, when the second integrated circuit IC2c transfers a signal to a first integrated circuit IC1 through the pad P_F2a, the driver circuit DRC2a may be activated, and the receiver circuit REC2a may be inactivated. When the second integrated circuit IC2c receives a signal from the first integrated circuit IC1 through the pad P_F2a, the receiver circuit REC2a may be activated, while the driver circuit DRC2a may be inactivated.

Both the driver circuit DRC2a and the receiver circuit REC2a may be activated at a test mode TM under a control of the loopback circuit LB2a. At the test mode TM, a test signal transferred from a third integrated circuit IC3 to the pad P_F1a may be output through the driver circuit DRC2a. A signal output through the driver circuit DRC2a may be received by the receiver circuit REC2a. That is, the signal received by the receiver circuit REC2a may be transferred to the third integrated circuit IC3 through the pad P_F1a. Accordingly, the loopback circuit LB2a may test a characteristic of a signal transferred through the pad P_F1a, the receiver circuit REC1a, the internal circuit CCa, the driver circuit DRC2a, the pad P_F2a, the receiver circuit REC2a, the internal circuit CCa, and the driver circuit DRC1a at the test mode TM.

The loopback circuit LB2b may operate in the same method as the loopback circuit LB2a. Accordingly, the loopback circuit LB2b may test a characteristic of a signal transferred through the pad P_F1b, the receiver circuit REC1b, the internal circuit CCb, the driver circuit DRC2b, the pad P_F2b, the receiver circuit REC2b, the internal circuit CCb, and the driver circuit DRC1b at the test mode TM.

That is, the loopback circuits LB2a and LB2b may support a self-loopback test.

Figure 6:
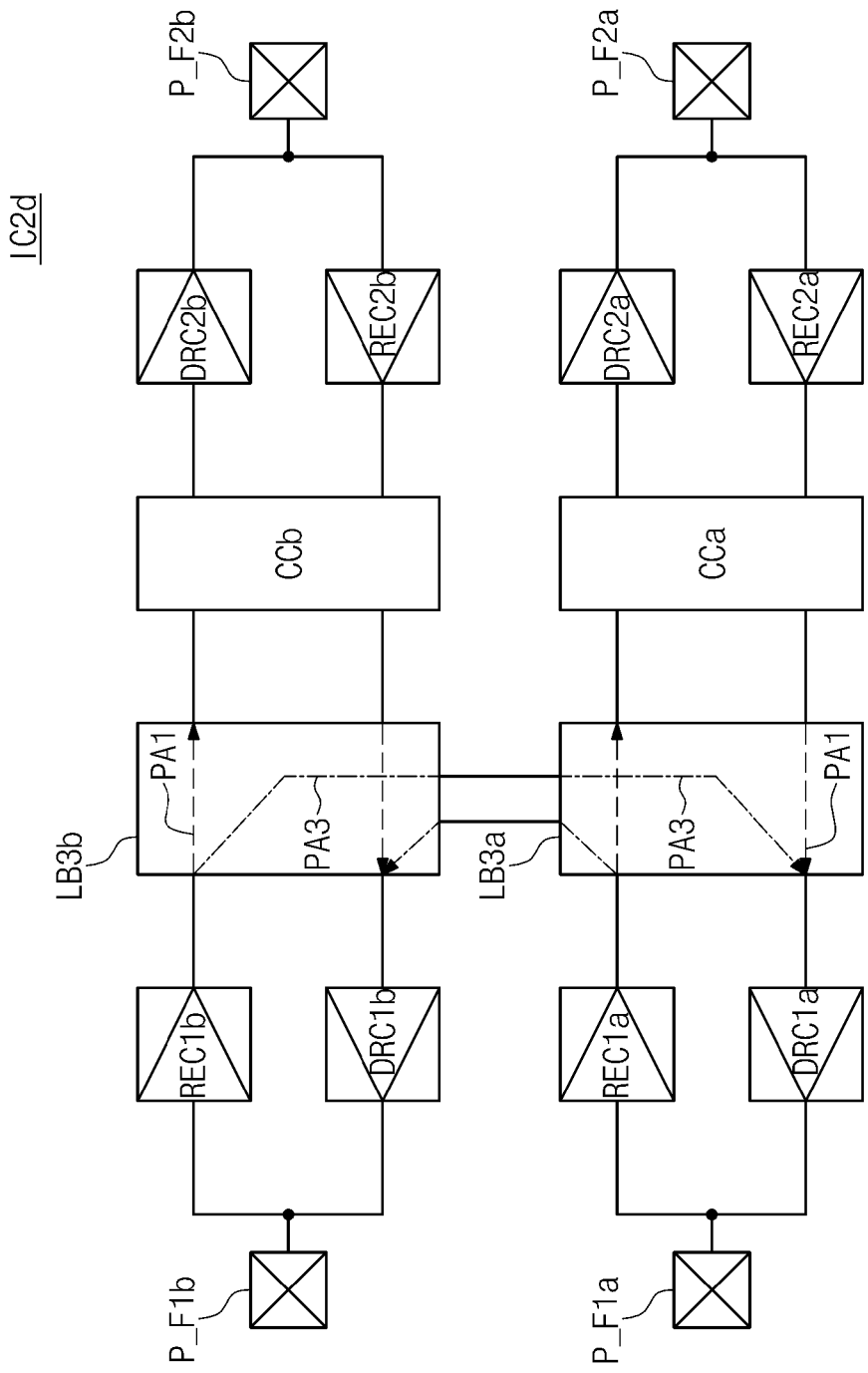
FIG. 6 is a block diagram schematically illustrating a second integrated circuit according to an example embodiment of the inventive concepts.

FIG. 6 is a block diagram schematically illustrating a second integrated circuit IC2d according to an example embodiment of the inventive concepts. Referring to FIGS. 1 and 6, a second integrated circuit IC2d may include pads P_F1a, P_F1b, P_F2a, and P_F2b, receiver circuits REC1a, REC1b, REC2a, and REC2b, driver circuits DRC1a, DRC1b, DRC2a, and DRC2b, and loopback circuits LB3a and LB3b, and internal circuits CCa and CCb.

As described with reference to FIG. 2, the loopback circuit LB3a may be provided between the receiver circuit REC1a and the internal circuit CCa and between the driver circuit DRC1a and the internal circuit CCa. Furthermore, the loopback circuit LB3b may be provided between the receiver circuit REC1b and the internal circuit CCb and between the receiver circuit REC1b and the internal circuit CCb. In FIG. 4, at a normal mode, a loopback circuit LB3a or LB3b may be inactivated, and a signal path in a loopback circuit LB3a or LB3b may be formed along a first path PA1 marked by a dotted line. At a test mode, a loopback circuit LB3a or LB3b may be activated, and a signal path in a loopback circuit LB3a or LB3b may be formed along a third path PA3 marked by an alternate long and short dash lines.

As described with reference to FIG. 2, at the normal mode, the loopback circuit LB3a may electrically connect a first input connected to the receiver circuit REC1a with a second output connected to the driver circuit DRC2a. Furthermore, the loopback circuit LB3a may electrically connect a second input connected to the receiver circuit REC2a with a first input connected to the driver circuit DRC1a. At the normal mode, the loopback circuit LB3b may electrically connect the first input connected to the receiver circuit REC1b with the second output connected to the driver circuit DRC2b. Further, the loopback circuit LB3b may electrically connect the second input connected to the receiver circuit REC2b with the first output connected to the driver circuit DRC1b.

Unlike a description of FIG. 2, at the test mode, the loopback circuit LB3a may electrically connect the first input connected to the first receiver circuit REC1a with the first output of the loopback circuit LB3b connected to the driver circuit DRC1b through the loopback circuit LB3b. Furthermore, the loopback circuit LB3a may electrically connect the first output connected to the driver circuit DRC1a with the first input of the loopback circuit LB3b connected to the receiver circuit REC1b through the loopback circuit LB3b.

At the test mode, the loopback circuit LB3b may electrically connect the first input connected to the first receiver circuit REC1b with the first output of the loopback circuit LB3a connected to the driver circuit DRC1a through the loopback circuit LB3a. Alternatively, at the test mode, the loopback circuit LB3b may electrically connect the first output connected to the driver circuit DRC1b with the first input of the loopback circuit LB3a connected to the receiver circuit REC1a through the loopback circuit LB3a.

That is, the loopback circuits LB3a and LB3b may test a characteristic of signal transferred through the pad P_F1a, the receiver circuit REC1a, the driver circuit DRC1b, and the pad P_F1b at the test mode. Alternatively, the loopback circuits LB3a and LB3b may test a characteristic of signal transferred through the pad P_F1b, the receiver circuit REC1b, the driver circuit DRC1a, and the pad P_F1a at the test mode.

In sum, the loopback circuit LB3 may be provided at the second integrated circuit IC2d. At the test mode, the loopback circuit LB3 may support a test about a signal path between a third integrated circuit IC3 and the loopback circuit LB3 by feeding a signal, received through one pad connected to the third integrated circuit IC3, back to the third integrated circuit IC3 through another pad. For example, the loopback circuit LB3 may support a delivery-loopback test at the test mode. A signal path PA3 supported by the loopback circuit LB3 at the test mode may be a delivery-loopback signal path.

Figure 7:
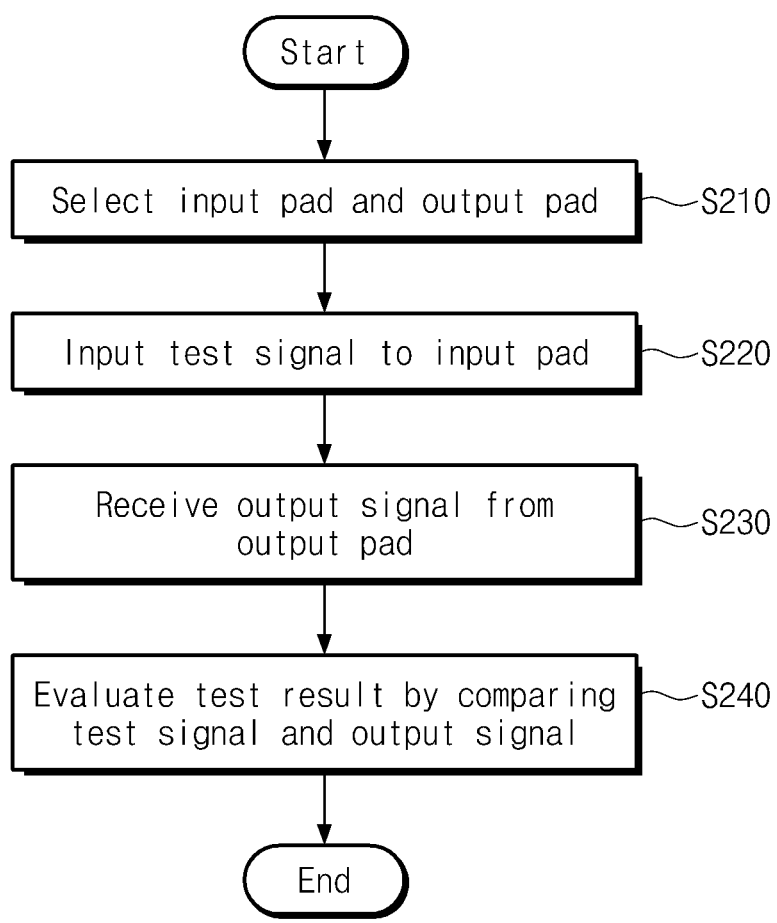
FIG. 7 is a flow chart schematically illustrating another method for testing the integrated circuits illustrated in FIG. 1.

FIG. 7 is a flow chart schematically illustrating another method for testing the integrated circuits illustrated in FIG. 1. An example method where a third integrated circuit IC3 tests a second integrated circuit IC2 may be illustrated in FIG. 7.

Referring to FIGS. 1 and 7, in step S210, an input pad and an output pad of the first pads P1 may be selected. For example, to-be-tested input and output pads of the first pads P1 of the second integrated circuit IC2 may be selected. For example, one first pad P1 may be selected as an input pad or an output pad, or some of the first pads P1 may be selected as input pads or output pads.

In step S220, a test signal may be provided to the selected input pad. In the case where one first pad P1 is selected as an input pad, the test signal may be provided to the selected first pad(s) P1. In the case where some of the first pad P1 are selected as input pads, test signals may be simultaneously or sequentially provided to of the selected first pads P1. The test signal may be a signal that swings between a relatively high level and a relatively low level periodically or have a desired (or alternatively, predetermined) pattern.

In step S230, an output signal may be received from an output pad. A loopback circuit LB3 of the second integrated circuit IC2 may support a delivery-loopback test described with reference to FIG. 6. Accordingly, an output from an output pad or output pads, which is different an input pad or input pads to which the test signal is provided, may be received.

In step S240, a test result may be evaluated (or measured) by comparing the test signal and the output signal.

Figure 8:
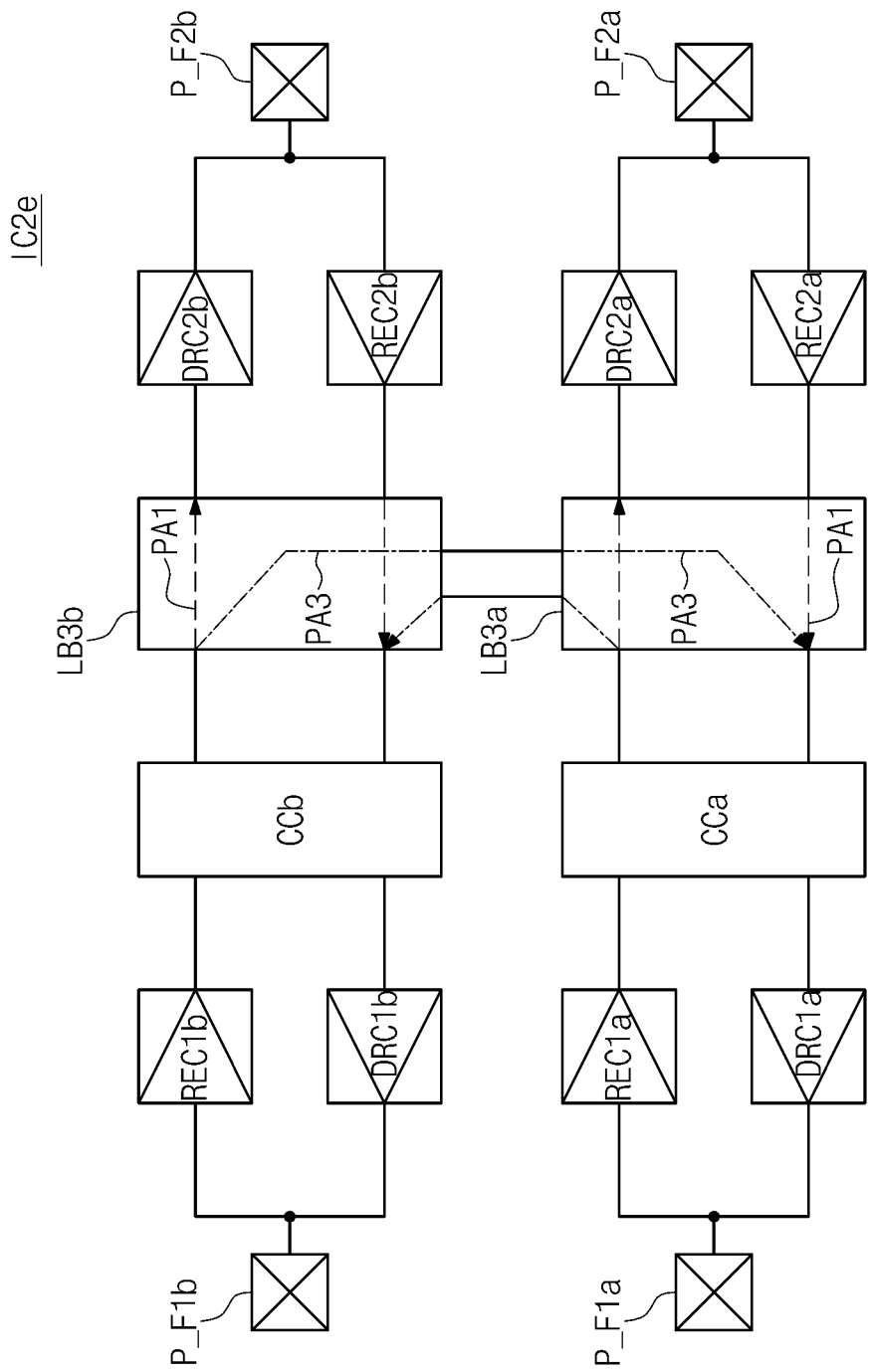
FIG. 8 is a block diagram schematically illustrating a second integrated circuit according to an example embodiment of the inventive concepts.

FIG. 8 is a block diagram schematically illustrating a second integrated circuit IC2e according to an example embodiment of the inventive concepts. Referring to FIGS. 1 and 8, a second integrated circuit IC2e may include pads P_F1a, P_F1b, P_F2a, and P_F2b, receiver circuits REC1a, REC1b, REC2a, and REC2b, driver circuits DRC1a, DRC1b, DRC2a, and DRC2b, and loopback circuits LB3a and LB3b, and internal circuits CCa and CCb.

As compared with a second integrated circuit IC2d illustrated in FIG. 6, in the second integrated circuit IC2e, the loopback circuit LB3a may be provided between the internal circuit CCa and the driver circuit DRC2a and between the internal circuit CCa and the receiver circuit REC2a. Furthermore, the loopback circuit LB3b may be provided between the internal circuit CCa and the driver circuit DRC2b and between the internal circuit CCa and the receiver circuit REC2b.

According to the second integrated circuit IC2e illustrated in FIG. 8, at the test mode, a characteristic of a signal transferred through the pad P_F1a, the receiver circuit REC1a, internal circuit CCa, the internal circuit CCb, the driver circuit DRC1b, and the pad P_F1b may be tested. Alternatively, at the test mode, a characteristic of a signal transferred through the pad P_F1b, the receiver circuit REC1b, internal circuit CCb, the internal circuit CCa, the driver circuit DRC1a, and the pad P_F1a may be tested. That is, the loopback circuits LB3a and LB3b may support a delivery-loopback test.

Figure 9:
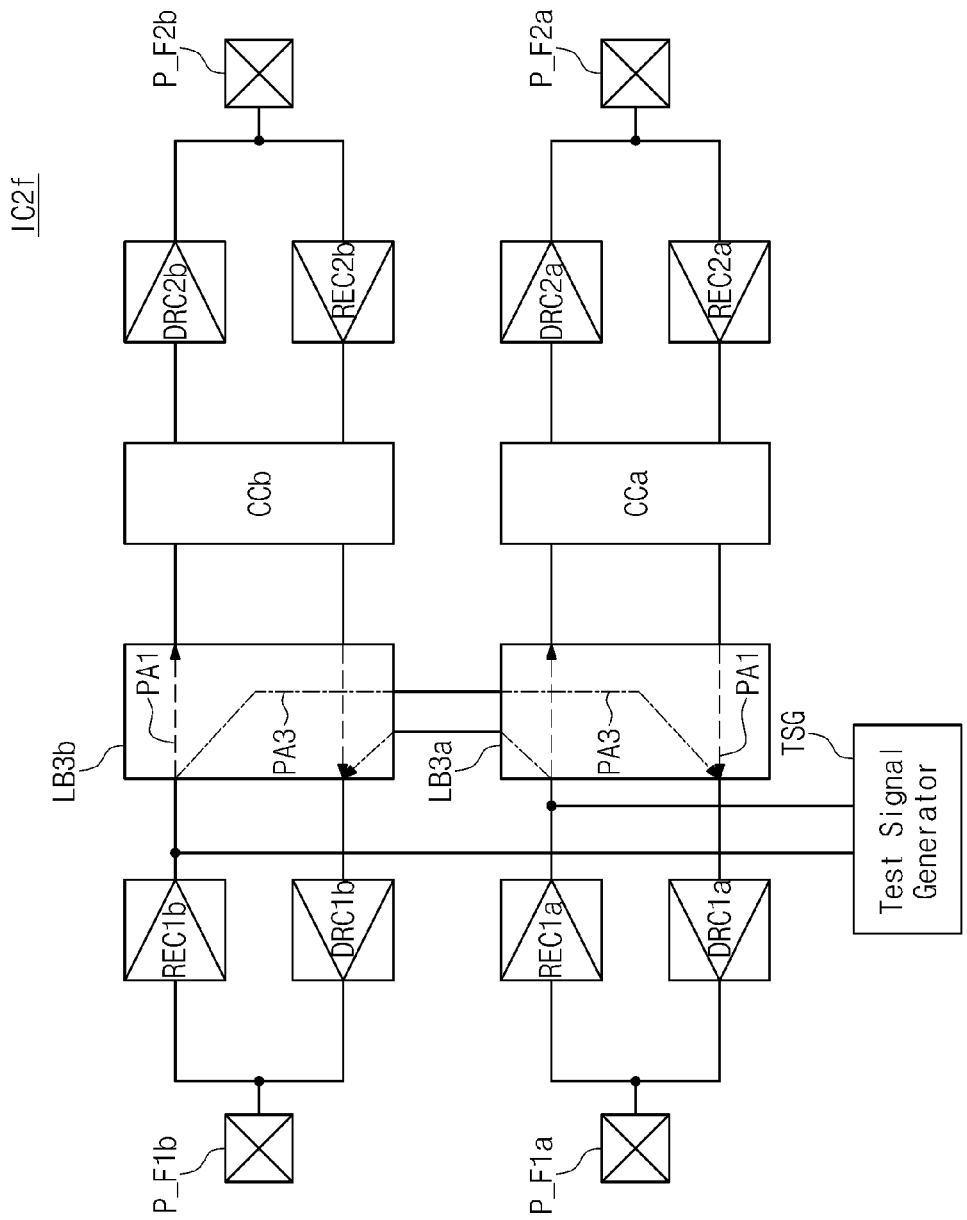
FIG. 9 is a block diagram schematically illustrating a second integrated circuit according to an example embodiment of the inventive concepts.

FIG. 9 is a block diagram schematically illustrating a second integrated circuit IC2f according to an example embodiment of the inventive concepts. Referring to FIGS. 1 and 9, a second integrated circuit IC2f may include pads P_F1a, P_F1b, P_F2a, and P_F2b, receiver circuits REC1a, REC1b, REC2a, and REC2b, driver circuits DRC1a, DRC1b, DRC2a, and DRC2b, loopback circuits LB3a and LB3b, internal circuits CCa and CCb, and a test signal generator TSG.

As compared with a second integrated circuit IC2d illustrated in FIG. 6, the second integrated circuit IC2f may further include the test signal generator TSG. The test signal generator TSG may be connected to an output of the receiver circuit REC1a or a first input of the loopback circuit LB3a connected to the receiver circuit REC1a. Furthermore, the test signal generator TSG may be connected to an output of the receiver circuit REC1b or a first input of the loopback circuit LB3b connected to the receiver circuit REC1b.

The test signal generator TSG may not operate at a normal mode. The test signal generator TSG may output a test signal at a test mode. For example, the test signal may be a signal that swings between a relatively high level and a relatively low level periodically or has a desired (or alternatively, predetermined) pattern.

According to the test signal generator TSG, at the test mode, a test signal may be transferred to a first input of the loopback circuit LB3a or a first input of the loopback circuit LB3b. According to an example embodiment, a test signal transferred to the first input of the loopback circuit LB3a at the test mode may be transferred to a third integrated circuit IC3 through the loopback circuit LB3b, the driver circuit DRC1b, and the pad P_F1b. Alternatively, a test signal transferred to the first input of the loopback circuit LB3b at the test mode may be transferred to the third integrated circuit IC3 through the loopback circuit LB3a, the driver circuit DRC1a, and the pad P_F1a. Accordingly, a signal transfer characteristic different from those of example embodiments described with reference to FIGS. 2 to 8 may be tested.

Figure 10:
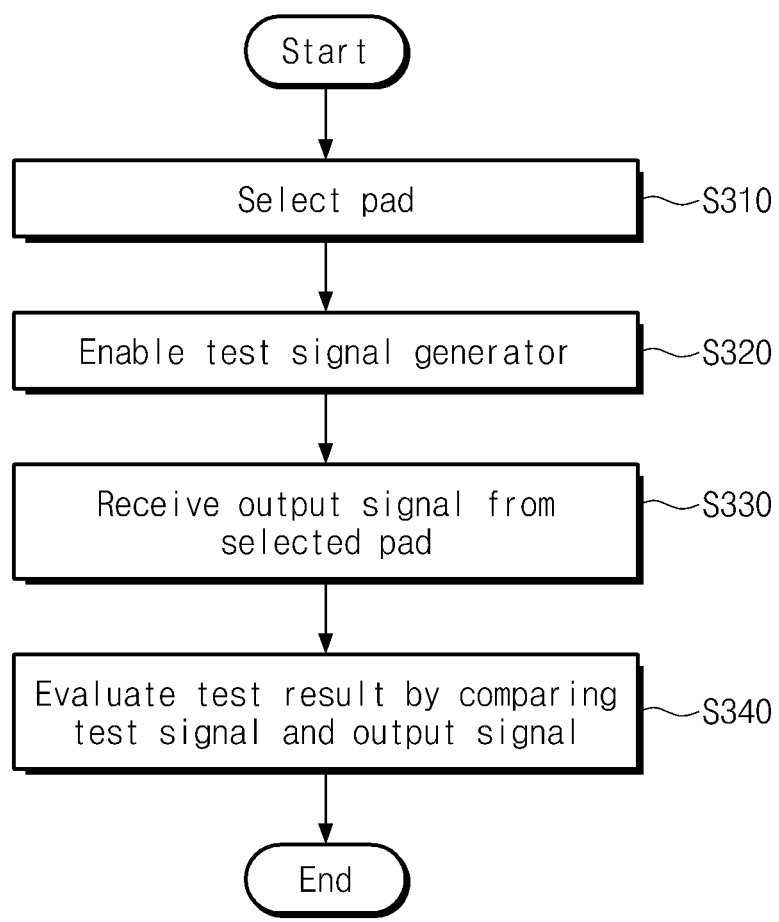
FIG. 10 is a flow chart schematically illustrating a method for testing the integrated circuit illustrated in FIG. 1.

FIG. 10 is a flow chart schematically illustrating a method for testing the integrated circuits illustrated in FIG. 1. An example method where a third integrated circuit IC3 tests a second integrated circuit IC2 may be illustrated in FIG. 10.

Referring to FIGS. 1 and 10, in step S310, a pad from among the first pads P1 may be selected. For example, a to-be-tested pad of first pads P1 of the second integrated circuit IC2 may be selected. For example, one or some of the first pads P1 may be selected.

In step S320, a test signal generator TSG may be activated. The test signal generator TSG may output a test signal to a node or nodes corresponding to an output node of a receiver circuit and/or an input of the loopback circuit, which are associated with the selected pad.

In step S330, an output signal may be received from the selected pad.

In step S340, a test result may be evaluated (or measured) by comparing the test signal and the output signal.

Figure 11:
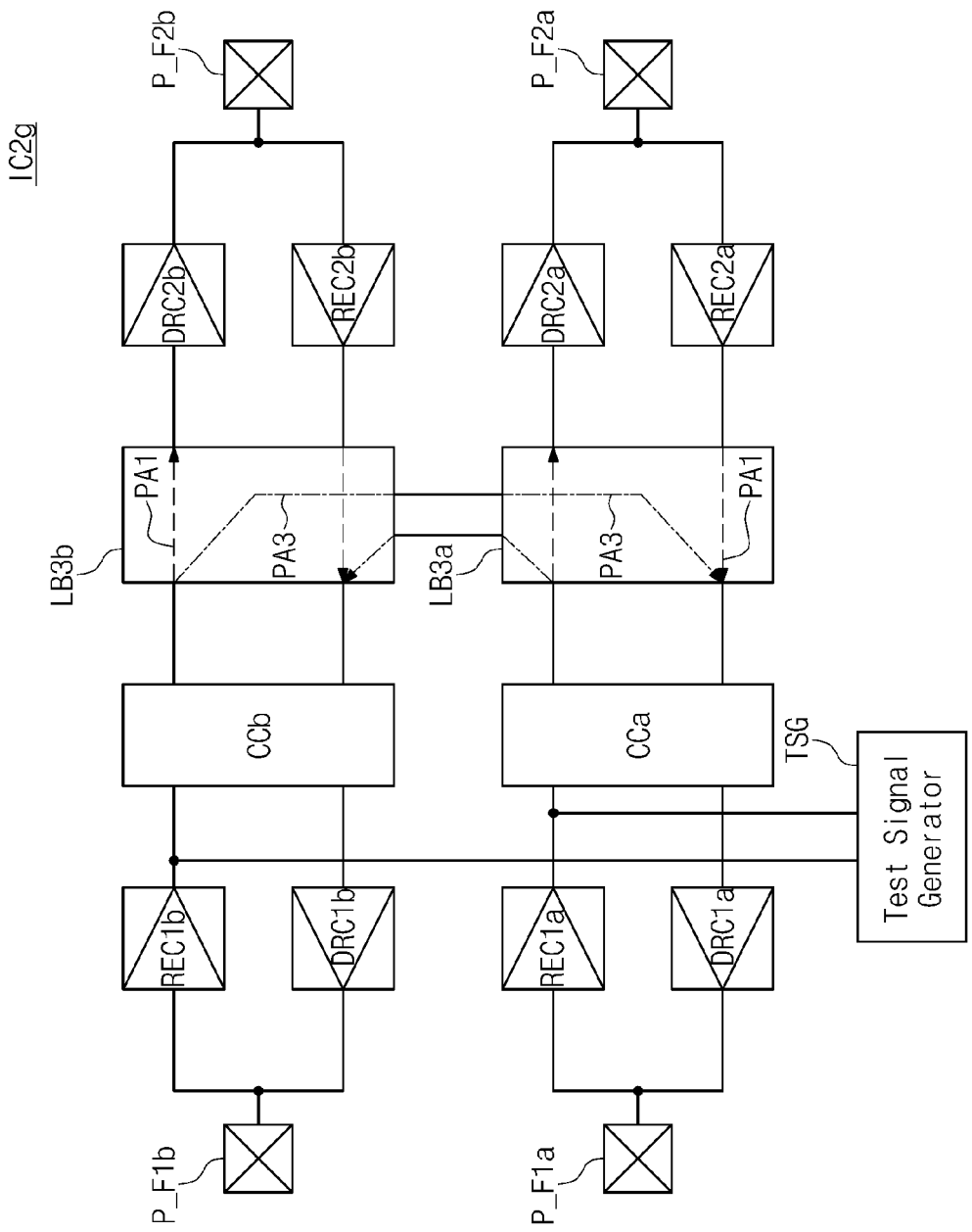
FIG. 11 is a block diagram schematically illustrating a second integrated circuit according to an example embodiment of the inventive concepts.

FIG. 11 is a block diagram schematically illustrating a second integrated circuit IC2f according to an example embodiment of the inventive concepts. Referring to FIGS. 1 and 11, a second integrated circuit IC2g may include pads P_F1a, P_F1b, P_F2a, and P_F2b, receiver circuits REC1a, REC1b, REC2a, and REC2b, driver circuits DRC1a, DRC1b, DRC2a, and DRC2b, loopback circuits LB3a and LB3b, internal circuits CCa and CCb, and a test signal generator TSG.

As compared with a second integrated circuit IC2f illustrated in FIG. 9, in the second integrated circuit IC2g, the loopback circuit LB3a may be provided between the internal circuit CCa and the driver circuit DRC2a and between the internal circuit CCa and the receiver circuit REC2a. Furthermore, the loopback circuit LB3b may be provided between the internal circuit CCb and the driver circuit DRC2b and between the internal circuit CCb and the receiver circuit REC2b.

According to the test signal generator TSG, at the test mode, a test signal may be transferred to an output node of the receiver circuit REC1a or an output node of the receiver circuit REC1b. According to the loopback circuits LB3a and LB3b, a test signal transferred to the output node of the receiver circuit REC1a at the test mode may be transferred to a third integrated circuit IC3 through the internal circuit CCa, the loopback circuit LB3a, the loopback circuit LB3b, the internal circuit CCb, the driver circuit DRC1b, and the pad P_F1b. Alternatively, a test signal transferred to the output node of the receiver circuit REC1b at the test mode may be transferred to the third integrated circuit IC3 through the internal circuit CCb, the loopback circuit LB3b, the loopback circuit LB3a, the internal circuit CCa, the driver circuit DRC1a, and the pad P_F1a. Accordingly, a signal transfer characteristic different from those of example embodiments described with reference to FIGS. 2 to 8 may be tested.

Figure 12:
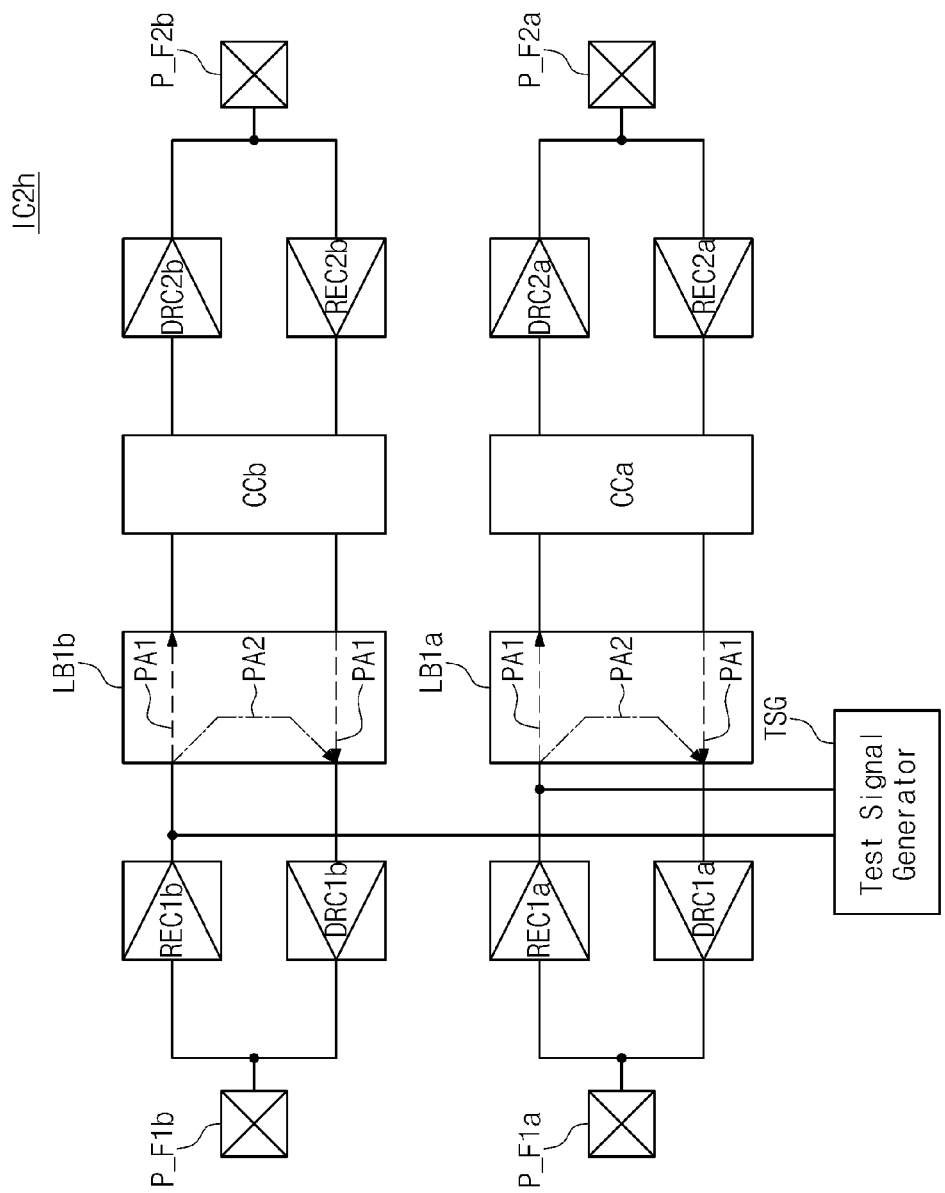
FIG. 12 is a block diagram schematically illustrating a second integrated circuit according to an example embodiment of the inventive concepts.

FIG. 12 is a block diagram schematically illustrating a second integrated circuit IC2h according to an example embodiment of the inventive concepts. Referring to FIGS. 1 and 12, a second integrated circuit IC2h may include pads P_F1a, P_F1b, P_F2a, and P_F2b, receiver circuits REC1a, REC1b, REC2a, and REC2b, driver circuits DRC1a, DRC1b, DRC2a, and DRC2b, loopback circuits LB1a and LB1b, internal circuits CCa and CCb, and a test signal generator TSG.

As compared with a second integrated circuit IC2a illustrated in FIG. 2, the second integrated circuit IC2h may further include a test signal generator TSG. That is, the second integrated circuit IC2h may support a self-loopback test using a test signal.

In example embodiments, the test signal generator TSG may be added to a second integrated circuit IC2b described with reference to FIG. 4. Furthermore, the test signal generator TSG may be added to a second integrated circuit IC2c described with reference to FIG. 5.

In FIGS. 9 to 12, the test signal generator TSG may be illustrated as outputting a test signal to an output node of a receiver circuit REC. However, a position of a node at which a test signal output by the test signal generator TSG is received may not be limited.

Figure 13:
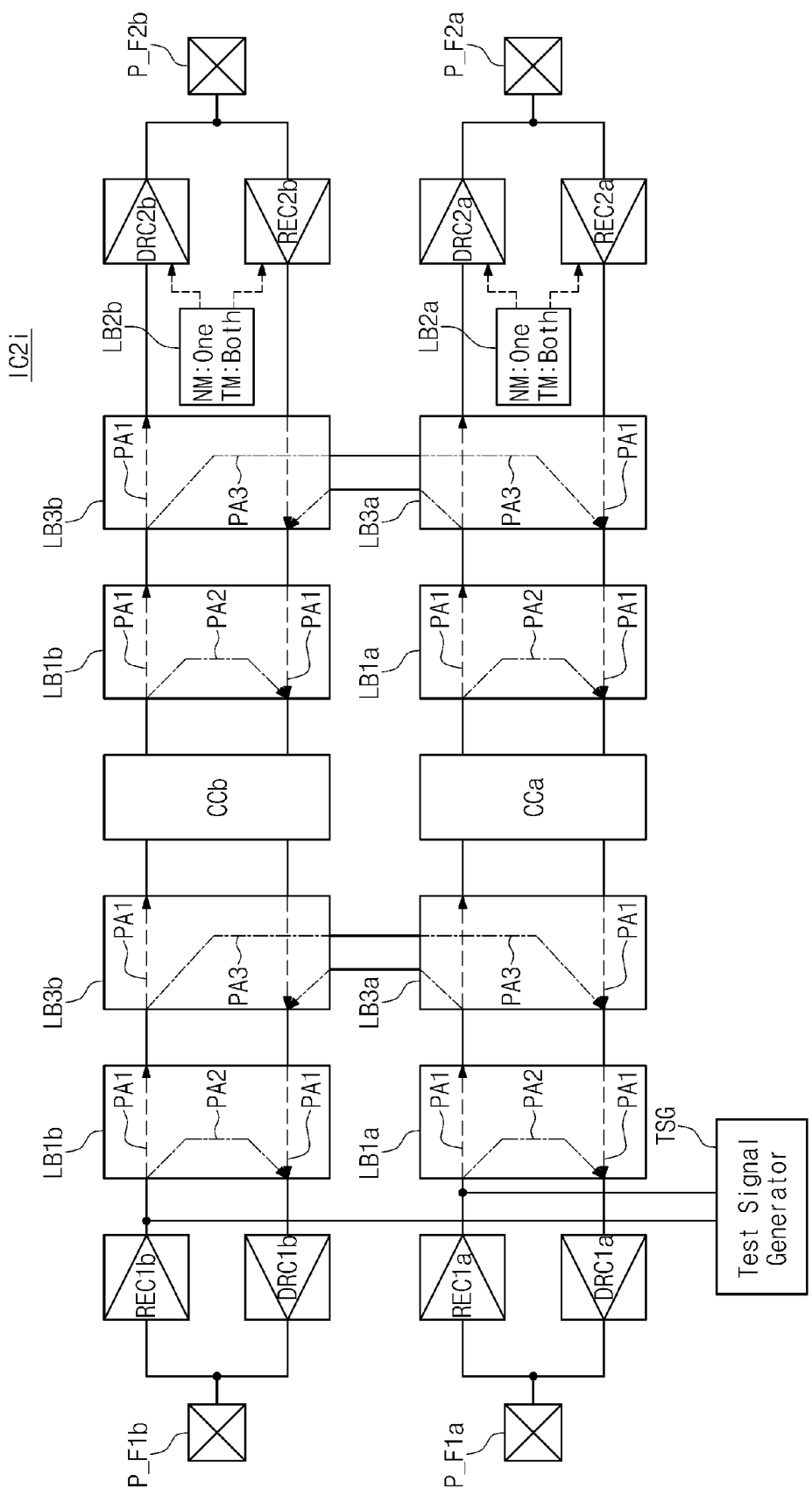
FIG. 13 is a block diagram schematically illustrating a second integrated circuit according to an example embodiment of the inventive concepts.

FIG. 13 is a block diagram schematically illustrating a second integrated circuit IC2i according to an example embodiment of the inventive concepts. Referring to FIGS. 1 and 13, a second integrated circuit IC2i may include pads P_F1a, P_F1b, P_F2a, and P_F2b, receiver circuits REC1a, REC1b, REC2a, and REC2b, driver circuits DRC1a, DRC1b, DRC2a, and DRC2b, loopback circuits LB1a, LB1b, LB2a, LB2b, LB3a, and LB3b, internal circuits CCa and CCb, and a test signal generator TSG.

As described with reference to FIGS. 2 to 5, the loopback circuits LB1a, LB1b, LB2a, and LB2b implemented in a second integrated circuit IC2 may support a self-loopback test. As described with reference to FIGS. 6 to 8, the loopback circuits LB3a and LB3b implemented in the second integrated circuit IC2 may support a delivery-loopback test. As described with reference to FIGS. 9 to 12, the second integrated circuit IC2 may support a test using a test signal that an embedded test signal generator TSG generates.

Figure 14:
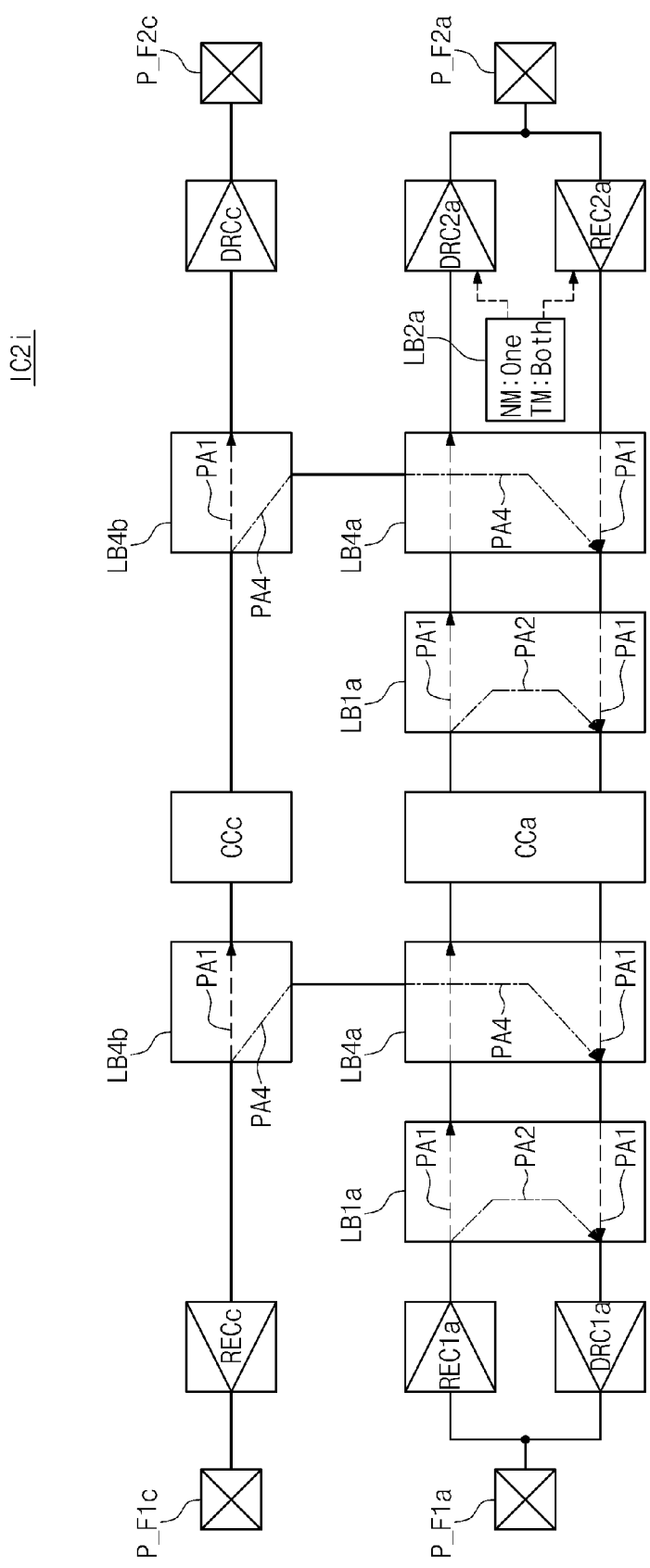
FIG. 14 is a block diagram schematically illustrating a second integrated circuit according to an example embodiment of the inventive concepts.

FIG. 14 is a block diagram schematically illustrating a second integrated circuit IC2j according to an example embodiment of the inventive concepts. Referring to FIGS. 1 and 14, a second integrated circuit IC2j may include pads P_F1a, P_F2a, P_F1c, and P_F2c, receiver circuits REC1a, REC2a, and RECc, driver circuits DRC1a, DRC2a, and DRCc, loopback circuits LB1a, LB2a, LB4a, and LB4b, and internal circuits CCa and CCc.

Unlike a second integrated circuit IC2i described with reference to FIG. 13, in the second integrated circuit IC2j, a first set of the loopback circuits LB1a and LB4a may be provided between the receiver circuit REC1a and the internal circuit CCa and between the driver circuit DRC1a and the internal circuit CCa. Furthermore, in the second integrated circuit IC2j, a second set of the loopback circuits LB1a and LB4a may be provided between the internal circuit CCa and the driver circuit DRC2a and between the internal circuit CCa and the receiver circuit REC2a.

The pad P_F1c may be connected to the receiver circuit RECc, and the pad P_F2c may be connected to the driver circuit DRCc. The first loopback circuit LB4b may be provided between the receiver circuit RECc and the internal circuit CCc, and the second loopback circuit LB4b may be provided between the driver circuit DRCc and the internal circuit CCc.

In example embodiments, at a normal mode, the loopback circuits LB4a and LB4b may be inactivated and a signal path in the loopback circuits LB4a and LB4b may be formed along a first path PA1 marked by a dotted line. At a test mode, the loopback circuits LB4a and LB4b may be activated, and a signal path in the loopback circuits LB4a and LB4b may be a fourth path PA4 marked by an alternate long and short dash lines.

The loopback circuits LB4a and LB4b may support a unidirectional delivery-loopback test from the loopback circuit LB4b to the loopback circuit LB4a at the test mode. The signal path PA4 supported by the loopback circuits LB4a and LB4b at the test mode may be a unidirectional delivery-loopback signal path.

In example embodiments, the loopback circuit LB4b may be implemented with a simple branch node instead of a circuit for selecting a signal path according to the normal mode or the test mode.

Figure 15:
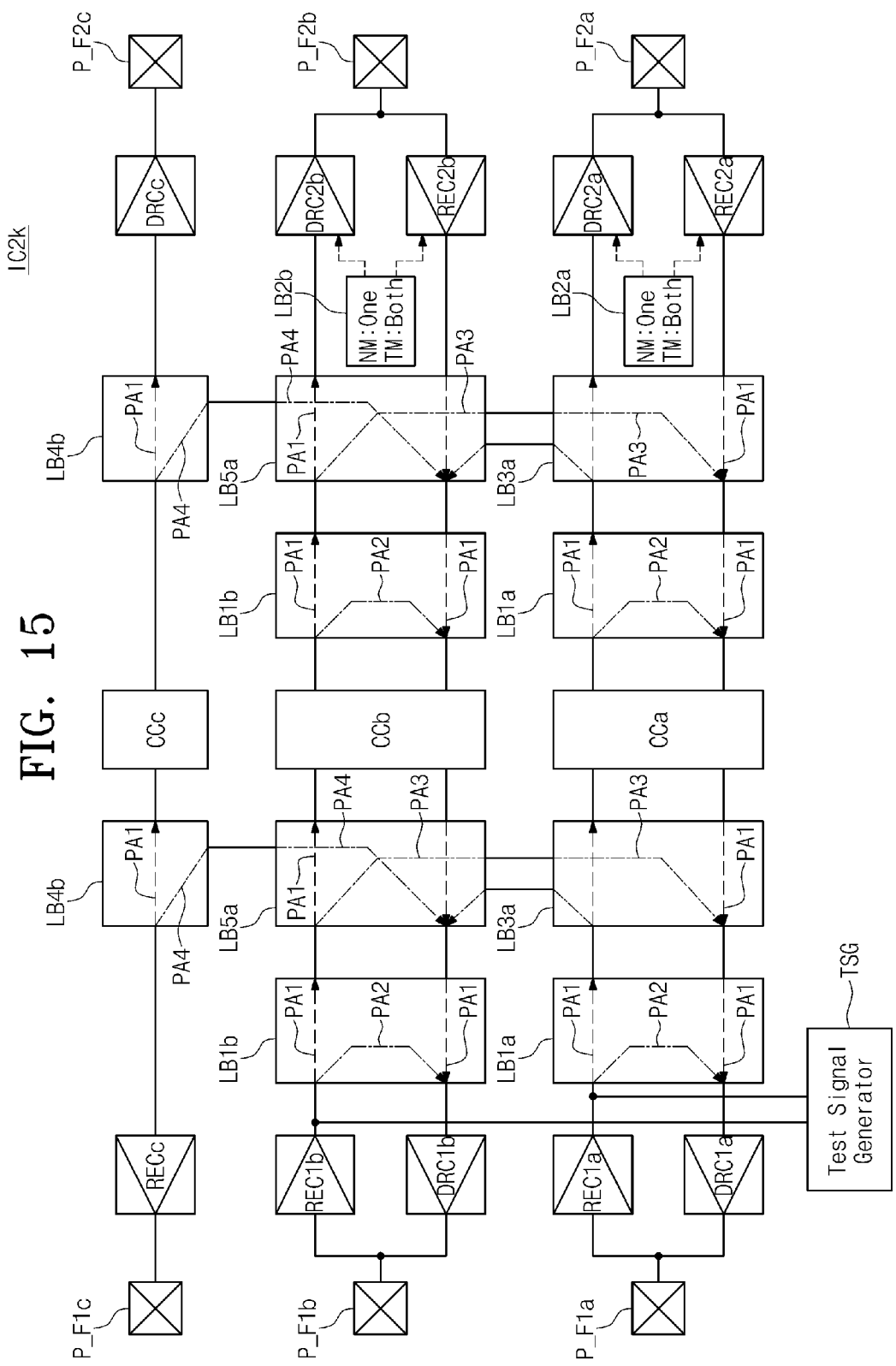
FIG. 15 is a block diagram schematically illustrating a second integrated circuit according to an example embodiment of the inventive concepts.

FIG. 15 is a block diagram schematically illustrating a second integrated circuit IC2k according to an example embodiment of the inventive concepts. Referring to FIGS. 1 and 15, a second integrated circuit IC2k may include pads P_F1a, P_F2a, P_F1b, P_F2b, P_F1c, and P_F2c, receiver circuits REC1a, REC1b, REC2a, REC2b, and RECc, driver circuits DRC1a, DRC1b, DRC2a, DRC2b, and DRCc, loopback circuits LB1a, LB1b, LB2a, LB2b, LB4b, LB5a, and LB5b, and internal circuits CCa, CCb, and CCc.

The second integrated circuit IC2k illustrated in FIG. 15 may have a structure in which a second integrated circuit IC2i illustrated in FIG. 13 and a second integrated circuit IC2j illustrated in FIG. 14 are combined. As compared with the second integrated circuit IC2i illustrated in FIG. 13, the second integrated circuit IC2k may include loopback circuits LB5a instead of loopback circuits LB3b. As compared with the second integrated circuit IC2j illustrated in FIG. 14, the loopback circuits LB4b may be electrically connected to the loopback circuits LB5a instead of the loopback circuits LB4a.

At a test mode, the loopback circuit LB5a may electrically connect one of an input of the loopback circuit LB4b and a first input (e.g., an input corresponding to the receiver circuit REC1a) of the loopback circuit LB3a to a first output (e.g., an output corresponding to the driver circuit DRC1b) of the loopback circuit LB5a. That is, the loopback circuit LB5a may support a delivery-loopback test together with the loopback circuit LB3a. Furthermore, the loopback circuit LB5a may support a unidirectional delivery-loopback test together with the loopback circuit LB4b.

In FIG. 15, the loopback circuit LB4b may be illustrated as being electrically connected to the loopback circuit LB5a. However, the second integrated circuit IC2k may be changed such that the loopback circuit LB4b is electrically connected to the loopback circuit LB1b. In this case, the loopback circuit LB1b may support a self-loopback test or a unidirectional delivery-loopback test.

Figure 16:
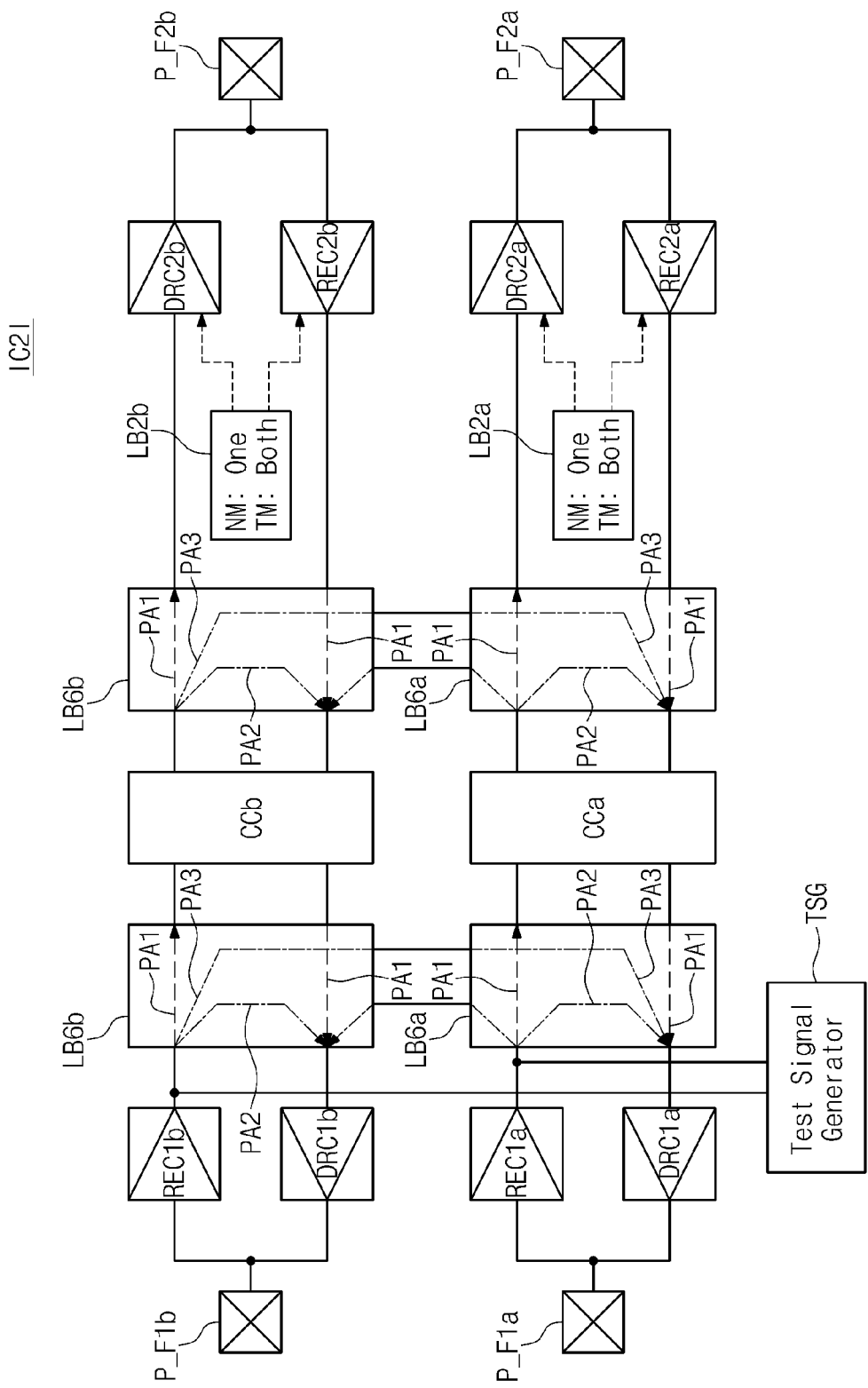
FIG. 16 is a block diagram schematically illustrating a second integrated circuit according to an example embodiment of the inventive concepts.

FIG. 16 is a block diagram schematically illustrating a second integrated circuit IC2l according to an example embodiment of the inventive concepts. Referring to FIGS. 1 and 16, a second integrated circuit IC2l may include pads P_F1a, P_F2a, P_F1b, and P_F2b, receiver circuits REC1a, REC1b, REC2a, and REC2b, driver circuits DRC1a, DRC1b, DRC2a, and DRC2b, loopback circuits LB6a, LB6b, LB2a, and LB2b, and internal circuits CCa and CCb.

As compared with a second integrated circuit IC2i described with reference to FIG. 13, loopback circuits LB1 and LB2 of the second integrated circuit IC2i may be combined with the loopback circuit LB6 of the second integrated circuit IC2l. For example, the loopback circuits LB6a and LB6b may support at least one of a self-loopback test and a delivery-loopback test at a test mode.

As described with reference to FIG. 15, the second integrated circuit IC2i may be changed such that a unidirectional delivery-loopback test is also supported by the loopback circuits LB6a and LB6b.

Figure 17:
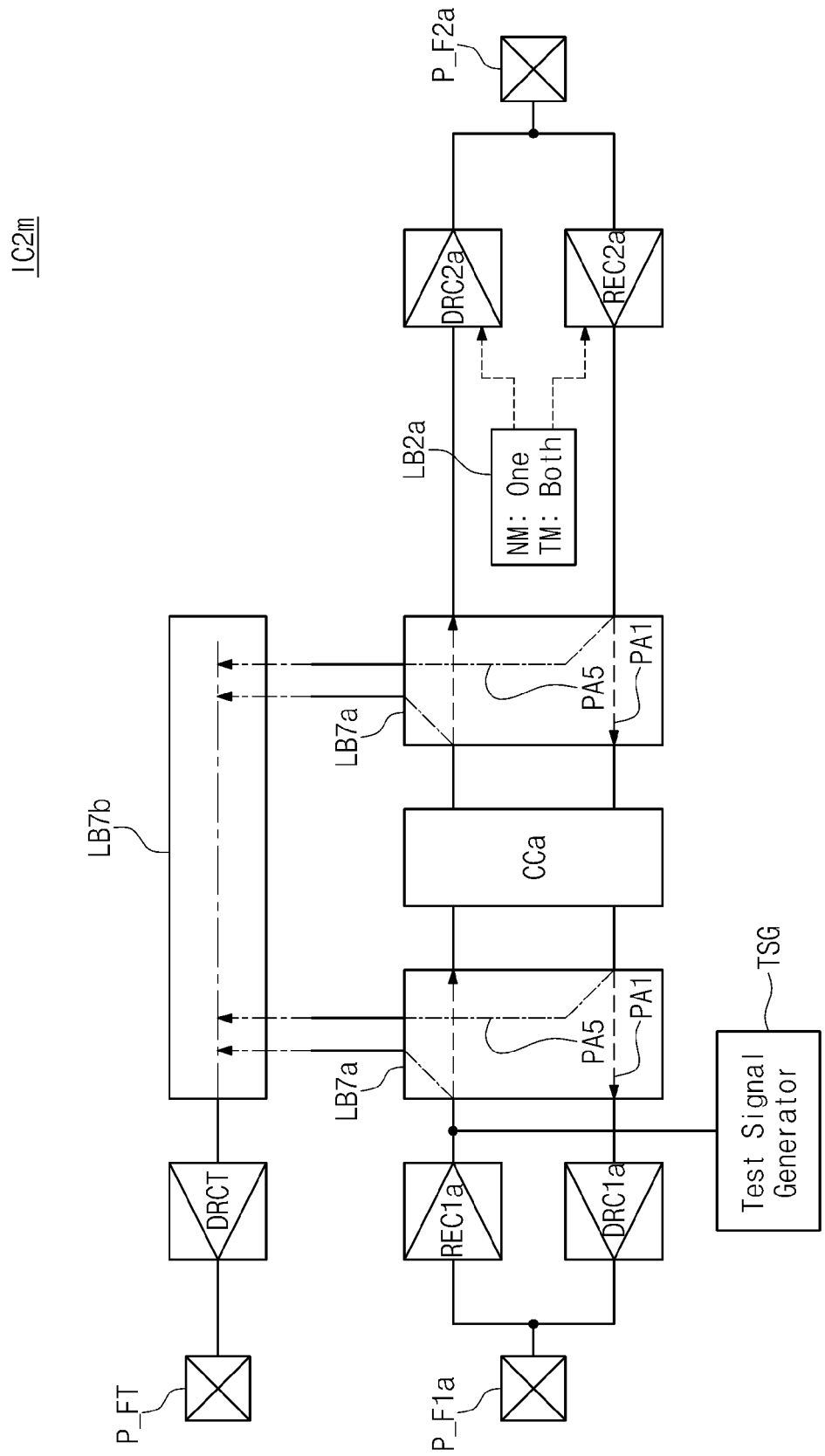
FIG. 17 is a block diagram schematically illustrating a second integrated circuit according to an example embodiment of the inventive concepts.

FIG. 17 is a block diagram schematically illustrating a second integrated circuit IC2m according to an example embodiment of the inventive concepts. Referring to FIGS. 1 and 17, a second integrated circuit IC2m may include pads P_F1a, P_F2a, and P_FT, receiver circuits REC1a and REC2a, driver circuits DRC1a, DRC2a, and DRCT, loopback circuits LB7a, LB7b, and LB2a, and an internal circuit CCa.

As compared with a second integrated circuit IC2i illustrated in FIG. 13, in the second integrated circuit IC2m, one loopback circuit LB7a may be provided between the receiver circuit REC1a and the internal circuit CCa and between the driver circuit DRC1a and the internal circuit CCa. Furthermore, another loopback circuit LB7b may be provided between the internal circuit CCa and the driver circuit DRC2a and between the internal circuit CCa and the receiver circuit REC2a.

The pad P_FT may be connected to the driver circuit DRCT. The driver circuit DRCT may be connected to the loopback circuit LB7b. In example embodiments, the pad P_FT may be a dedicated pad through which a test result is output. The pad P_FT may be connected to a first integrated circuit IC1, a third integrated circuit IC3, or another external device.

At a test mode, the loopback circuit LB7a may electrically connect one of a first input corresponding to the receiver circuit REC1a and a second input corresponding to the receiver circuit REC2a to the loopback circuit LB7b. The loopback circuit LB7b may transfer one of signals transferred from the loopback circuits LB7a to the driver circuit DRCT. That is, at the test mode, internal signals of the second integrated circuit IC2m may be output to the pad P_FT by the loopback circuits LB7a and LB7b. The loopback circuits LB7a and LB7b may support a loopback test using a test pad. A signal path PA5 proved by the loopback circuits LB7a and LB7b at the test mode may be a loopback signal path using the test pad.

As described with reference to FIGS. 2 to 16, various self-loopback circuits LB1 and LB2, delivery-loopback circuits LB3, unidirectional delivery-loopback circuits LB4, or combined loopback circuits LB5 and LB6 may be implemented in the second integrated circuit IC2m.

Figure 18:
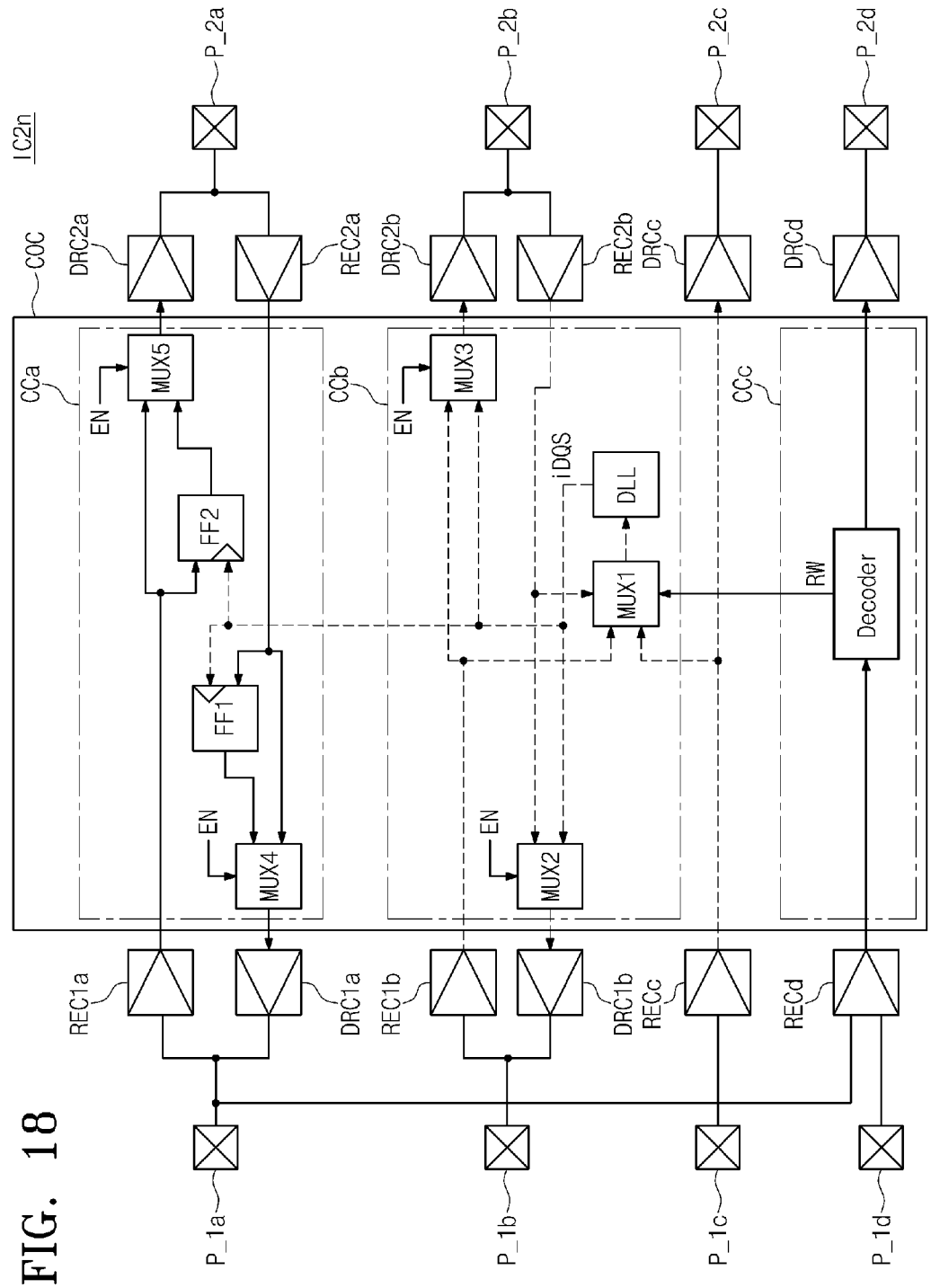
FIG. 18 is a block diagram schematically illustrating a second integrated circuit according to an example embodiment of the inventive concepts.

FIG. 18 is a block diagram schematically illustrating a second integrated circuit IC2n according to an example embodiment of the inventive concepts. Referring to FIGS. 1 and 18, a second integrated circuit IC2n may include pads P_1a to P1d and P_2a to P_2d, receiver circuits REC1a, REC1b, REC2a, REC2b, RECc, and RECd driver circuits DRC1a, DRC1b, DRC2a, DRC2b, DRCc, and DRCd, and internal circuits CCa to CCc.

The second integrated circuit IC2n may exchange a data signal DQ (now shown) with a third integrated circuit IC3 through the pad P_1a. The second integrated circuit IC2n may exchange the data signal DQ with a first integrated circuit IC1 through the pad P_2a. The pads P_1a and P_2a and the internal circuit CCa associated therewith may be provided as many as the number of channels, through which the data signal DQ is exchanged.

The second integrated circuit IC2n may exchange a data strobe signal DQS (not shown) with the third integrated circuit IC3 through the pad P_1b. The second integrated circuit IC2n may exchange the data strobe signal DQS with the first integrated circuit IC1 through the pad P_2b.

The second integrated circuit IC2n may receive a read enable signal /Re (not shown) from the third integrated circuit IC3 through the pad P_1c. The second integrated circuit IC2n may exchange the read enable signal /Re with the first integrated circuit IC1 through the pad P_2c.

The second integrated circuit IC2n may receive a control signal CT (not shown) from the third integrated circuit IC3 through the pad P_1d. The second integrated circuit IC2n may output the control signal CT to the first integrated circuit IC1 through the pad P_2d. For example, the control signal CT may include an address latch enable signal ALE, a command latch enable signal CLE, a write enable signal /WE, and a chip enable signal ICE.

A decoder may receive the control signal CT including the address latch enable signal ALE, the command latch enable signal CLE, the write enable signal /WE, and first to N-th chip enable signals ICE, from the pad P_1d through the receiver circuit REC2. The decoder may transfer the received control signal CT to the driver circuit DRCd.

In response to the control signal CT, the decoder may identify a command input cycle at which a command is received through the pad P_1a. During the command input cycle, the decoder may decode a command received through the pad P_1a. For example, the decoder may check whether an input command is a read command or a write command. The decoder may control a control signal RW according to the checking result. For example, the decoder may control the control signal RW with a first value when the input command is a read command. The decoder may control the control signal RW with a second value when the input command is a write command. The decoder may inactivate the control signal RW when the input command is not the read command or the write command.

The read enable signal /RE received through the receiver circuit RECc may be transferred to a first multiplexer MUX1 and the driver circuit DRCc.

The data strobe signal DQS received through the pad P_1b may be transferred to the first multiplexer MUX1 and a third multiplexer MUX3. The data strobe signal DQS received through the pad P_2b may be transferred to the first multiplexer MUX1 and a second multiplexer MUX2.

The first multiplexer MUX1 may receive the read enable signal from the pad P_1c through the receiver circuits REC1c, the data strobe signal DQS from the pad P_1b, the data strobe signal DQS from the pad P_2b, and the control signal RW from the decoder. When the control signal RW indicates a read operation, the first multiplexer MUX1 may transfer the read enable signal /RE received from the receiver circuit RECc and the data strobe signal DQS received from the pad P_2b to a delay locked loop DLL. When the control signal RW indicates a write operation, the first multiplexer MUX1 may transfer the data strobe signal DQS received from the pad P_1b to the delay locked loop DLL.

At the read operation, the delay locked loop DLL may receive the read enable signal /Re from the first multiplexer MUX1 and the data strobe signal DQS received from the pad P_2b. The delay locked loop DLL may detect a locking delay corresponding to the quarter of a period from the read enable signal /Re and may output an internal signal iDQS delayed by the quarter of the period from the data strobe signal DQS using the detected locking delay. At the write operation, the delay locked loop DLL may receive the data strobe signal DQS received from the pad P1b, from the first multiplexer MUX1. The delay locked loop DLL may detect a locking delay corresponding to the quarter of a period from the data strobe signal DQS and may output the internal signal iDQS delayed by the quarter of the period from the data strobe signal DQS using the detected locking delay. The internal signal iDQS may be transferred to the second multiplexer MUX2 and flip-flops FF1 and FF2.

At the read operation, the first flip-flop FF1 may adjust or retime data received through the pad P_2a in synchronization with the internal signal iDQS. At the write operation, the second flip-flop FF2 may adjust or retime data received through the pad P_1a in synchronization with the internal signal iDQS.

The second multiplexer MUX2 may receive the internal signal iDQS from the delay locked loop DLL and may receive the data strobe signal DQS through the pad P_2b. In response to an enable signal EN, the second multiplexer MUX2 may transfer the internal circuit iDQS or the data strobe signal DQS to the pad P_1b.

A third multiplexer MUX3 may receive the internal signal iDQS from the delay locked loop DLL and may receive the data strobe signal DQS through the pad P1b. In response to the enable signal EN, the third multiplexer MUX3 may transfer the internal circuit iDQS or the data strobe signal DQS to the pad P_2b.

A fourth multiplexer MUX4 may receive adjusted or retimed data from the first flip-flop FF1 and may receive data through the pad P_2a. In response to the enable signal EN, the fourth multiplexer MUX4 may transfer the adjusted or retimed data or the data received through the pad P_2a to the pad P_1a.

A fifth multiplexer MUX5 may receive adjusted or retimed data from the second flip-flop FF2 and may receive data through the pad P_1a. In response to the enable signal EN, the fifth multiplexer MUX5 may transfer the adjusted or retimed data or the data received through the pad P_1a to the pad P_2a.

When the enable signal EN is at an active state and the control signal RW indicates the write operation, a core circuit COC may output the internal signal iDQS to the pad P_2b and data adjusted or retimed by the second flip-flop FF2 to the pad P_2a. When the enable signal EN is at an active state and the control signal RW indicates the read operation, the core circuit COC may output the internal signal iDQS to the pad P_1b and data adjusted or retimed by the second flip-flop FF1 to the pad P_1a. For example, when the enable signal EN is at an active state, the core circuit COC may adjust or retime data conveyed between a memory controller (e.g., third integrated circuit IC3) and nonvolatile memories (e.g., second integrated circuits IC2). When the enable signal EN is at an inactive state, the core circuit COC may merely transfer signals between the memory controller (e.g., third integrated circuit IC3) and nonvolatile memories (e.g., second integrated circuits IC2).

In example embodiments, the flip-flops FF1 and FF2 and the multiplexers MUX4 and MUX5 may constitute the internal circuit CCa. The multiplexers MUX1 to MUX3 may constitute the internal circuit CCb. The decoder may form the internal circuit CCc. As described with reference to FIGS. 2 to 17, various loopback circuits LB may be provided in a second integrated circuit IC2n.

Figure 19:
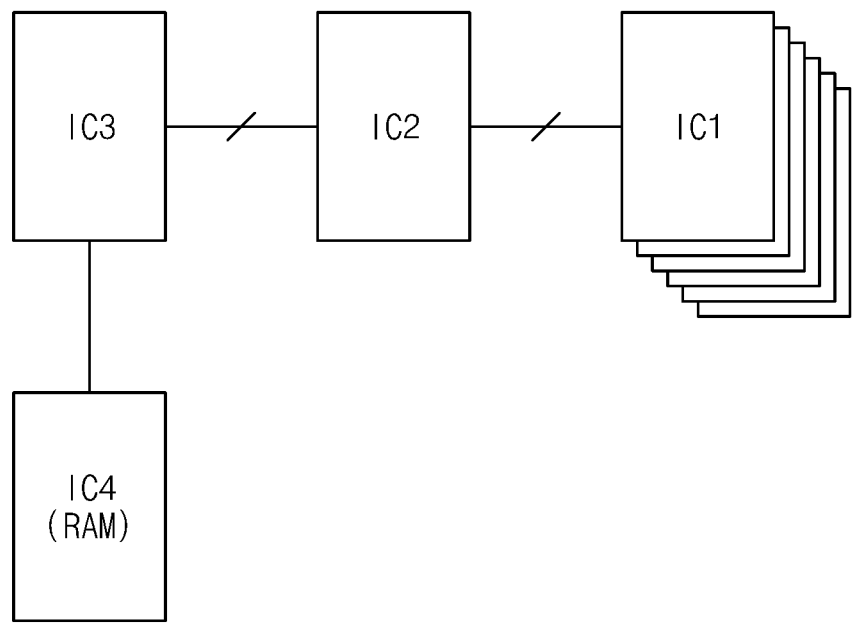
FIG. 19 is a block diagram schematically illustrating schematically illustrating integrated circuits according to an example embodiment of the inventive concepts.

FIG. 19 is a block diagram schematically illustrating schematically illustrating integrated circuits IC1 to IC3 according to an example embodiment of the inventive concepts. Referring to FIG. 19, a third integrated circuit IC3 may be configured to communicate with a second integrated circuit IC2 and a fourth integrated circuit IC4. The second integrated circuit IC2 may be configured to communicate with a plurality of first integrated circuits IC1.

The third integrated circuit IC3 may be a memory controller configured to control the first integrated circuits IC1.

The second integrated circuit IC2 may be configured to arbitrate communication between the third integrated circuit IC3 and the first integrated circuits IC1. For example, the second integrated circuit IC2 may transfer a signal from the third integrated circuit IC3 to the first integrated circuits IC1, and may transfer signals from the first integrated circuits IC1 to the third integrated circuit IC3. The second integrated circuit IC2 may be configured to adjust or retime synchronization between a clock and/or a signal while transferring the clock and/or the signal.

The second integrated circuit IC2 may support a loopback test described with reference to FIGS. 2 to 17. The second integrated circuit IC2 may have a structure described with reference to FIG. 18.

The fourth integrated circuit IC4 may be a RAM that the memory controller uses as a buffer memory, a cache memory, a working memory, and the like.

The first to fourth integrated circuits IC1 to IC4 may be implemented in separate packages. At least two or more of the first to fourth integrated circuits IC1 to IC4 may be implemented in one package.

Figure 20:
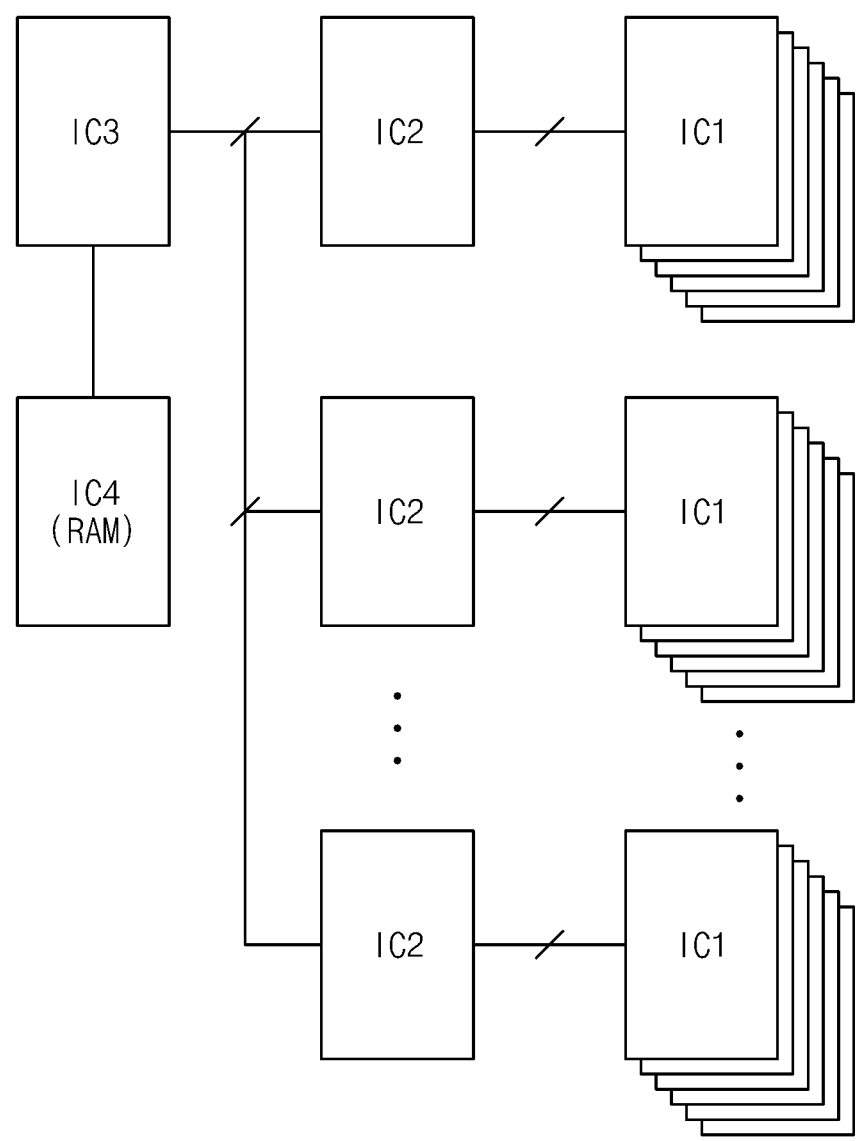
FIG. 20 is a block diagram schematically illustrating integrated circuits according to an example embodiment of the inventive concepts.

FIG. 20 is a block diagram schematically illustrating integrated circuits IC1 to IC4 according to an example embodiment of the inventive concepts. Referring to FIG. 20, a third integrated circuit IC3 may be connected to a fourth integrated circuit IC4 and to a plurality of second integrated circuits IC2. Each of the second integrated circuits IC2 may be connected to a plurality of first integrated circuits IC1.

Each of the first integrated circuits IC1 may include a nonvolatile memory. Each of the second integrated circuits IC2 may be configured to perform retiming between the third integrated circuit IC3 and the first integrated circuits IC1. Each of the second integrated circuits IC2 may be configured to support a loopback test.

The third integrated circuit IC3 may be a memory controller that controls the first integrated circuits IC1 through the second integrated circuits IC2.

The fourth integrated circuit IC4 may be a RAM that is used as, for example, a buffer memory, a cache memory, or a working memory.

The first to fourth integrated circuits IC1 to IC4 may form a solid state drive (SSD).

Figure 21:
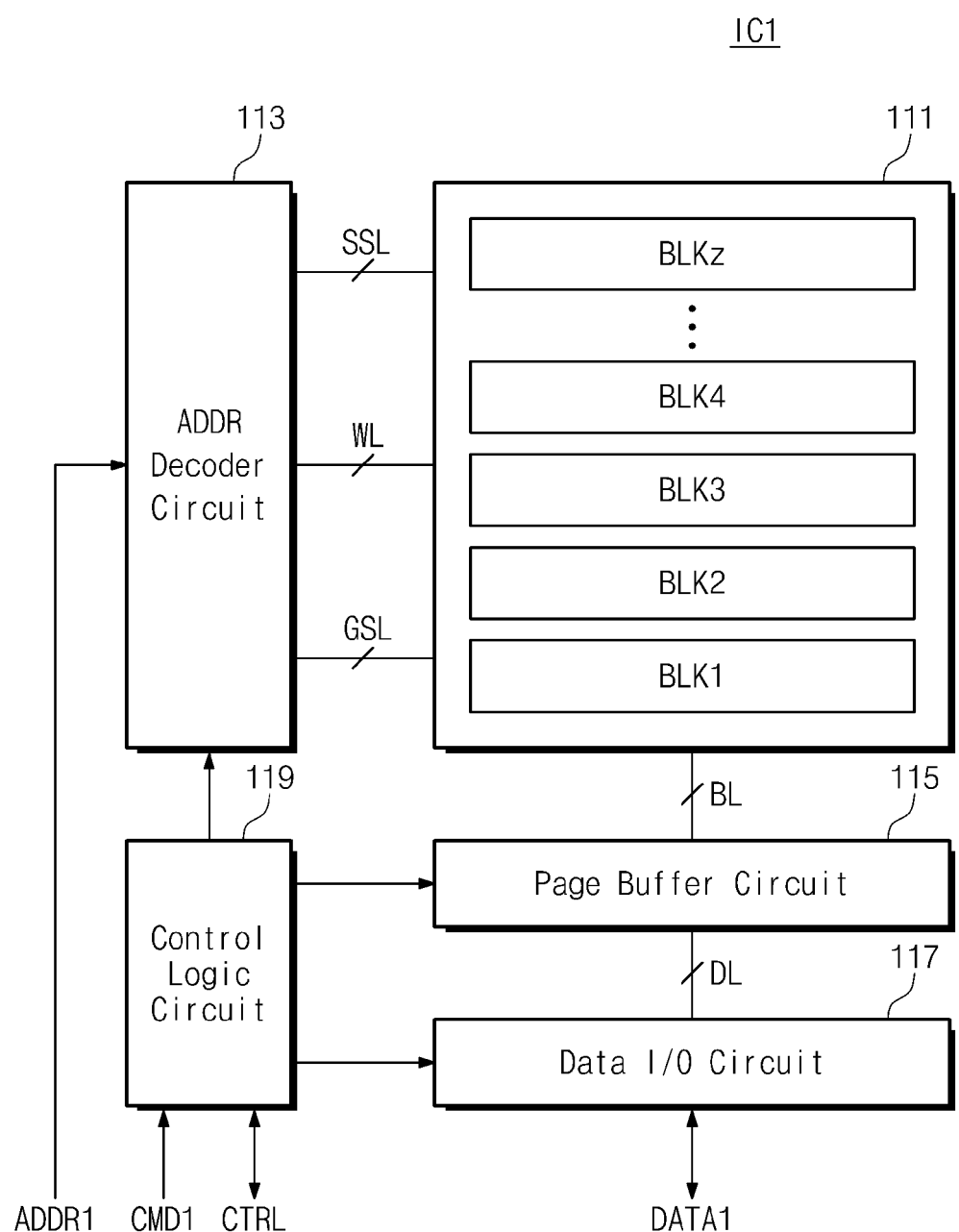
FIG. 21 is a block diagram schematically illustrating a first integrated circuit according to an example embodiment of the inventive concepts.

FIG. 21 is a block diagram schematically illustrating a first integrated circuit IC1 according to an example embodiment of the inventive concepts. Referring to FIG. 21, a first integrated circuit IC1 may include a memory cell array 111, an address decoder circuit 113, a page buffer circuit 115, a data input/output circuit 117, and a control logic circuit 119.

The memory cell array 111 may include a plurality of memory blocks BLK1 through BLKz, each of which has a plurality of memory cells. Each memory block may be connected to the address decoder circuit 113 through at least one string selection line SSL, a plurality of word lines WL, and at least one ground selection line GSL. Each memory block may be connected to the page buffer circuit 115 through a plurality of bit lines BL. The memory blocks BLK1 through BLKz may be connected in common to the plurality of bit lines BL. Memory cells of the memory blocks BLK1 through BLKz may have the same structure. In example embodiments, each of the memory blocks BLK1 through BLKz may be an erase unit. An erase operation may be carried out by the memory block. Memory cells of a memory block may be erased at the same time. In other example embodiments, each sub memory block may be divided into a plurality of sub blocks. Each sub block may be an erase unit.

The address decoder circuit 113 may be connected to the memory cell array 111 through a plurality of ground selection lines GSL, the plurality of word lines WL, and a plurality of string selection lines SSL. The address decoder circuit 113 may operate in response to a control of the control logic circuit 119. The address decoder circuit 113 may receive a first address ADDR1 from a second integrated circuit IC2. The address decoder circuit 113 may decode the first address ADDR1 and may control voltages to be applied to the word lines WL depending on the decoded address.

For example, at programming, the address decoder circuit 113 may apply a program voltage to a selected word line of a selected memory block that the first address ADDR1 points out. The address decoder circuit 113 may also apply a pass voltage to unselected word lines of the selected memory block. At reading, the address decoder circuit 113 may apply a selection read voltage to a selected word line of a selected memory block that the first address ADDR1 points out. The address decoder circuit 113 may also apply a non-selection read voltage to unselected word lines of the selected memory block. At erasing, the address decoder circuit 113 may apply an erase voltage (e.g., a ground voltage or low voltages have a level similar to that of the ground voltage) to word lines of a selected memory block that the first address ADDR1 points out.

The page buffer circuit 115 may be connected to the memory cell array 111 through the bit lines BL. The page buffer circuit 115 may be connected to the data input/output circuit 117 through a plurality of data lines DL. The page buffer circuit 115 may operate in response to a control of the control logic circuit 119.

The page buffer circuit 115 may hold data to be programmed at memory cells of the memory cell array 111 or data read from memory cells thereof. During a program operation, the page buffer circuit 115 may store data to be stored in memory cells. The page buffer circuit 115 may bias the plurality of bit lines BL based on the stored data. The page buffer circuit 115 may serve as a write driver at a program operation. During a read operation, the page buffer circuit 115 may sense voltages of the bit lines BL and may store the sensed results. The page buffer circuit 115 may serve as a sense amplifier at a read operation.

The data input/output circuit 117 may be connected to the page buffer circuit 115 through the data lines DL. The data input/output circuit 117 may exchange first data DATA1 with a first or fourth integrated circuit IC1 or IC4.

The data input/output circuit 117 may temporarily store first data DATA1 that the second integrated circuit IC2 provides, and it may transfer the temporarily stored data to the page buffer circuit 115. The data input/output circuit 117 may temporarily store data transferred from the page buffer circuit 115 and transfers it to the second integrated circuit IC2. The data input/output circuit 117 may serve as a buffer memory.

The control logic circuit 119 may receive a first command CMD1 and a control signal CTRL from the second integrated circuit IC2. The control logic circuit 119 may decode the first command CMD1 thus received and may control an overall operation of the first integrated circuit IC1 according to the decoded command.

In example embodiments, during a read operation, the control logic circuit 119 may generate a data strobe signal DQS depending on a read enable signal /RE of the received control signal CTRL. During a write operation, the control logic circuit 119 may receive a data strobe signal DQS as the control signal CTRL.

Figure 22:
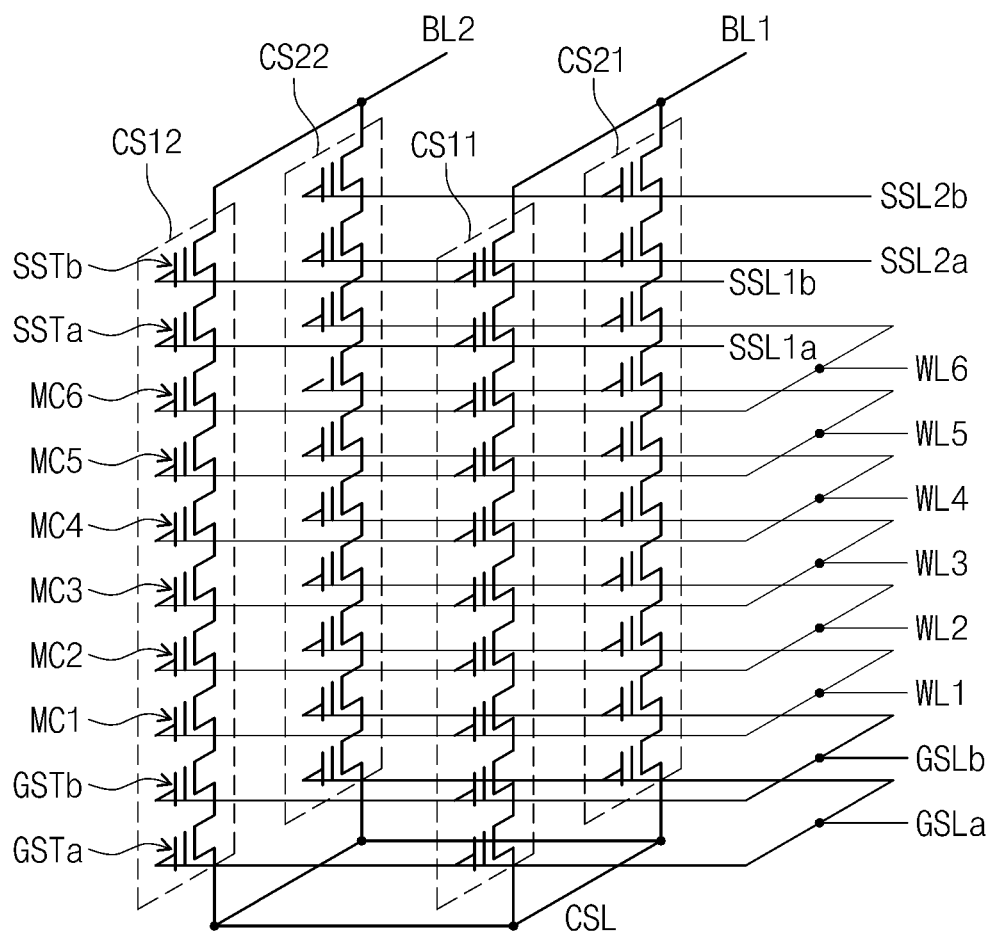
FIG. 22 is a circuit diagram schematically illustrating a memory block according to an example embodiment of the inventive concepts.

FIG. 22 is a circuit diagram schematically illustrating a memory block BLKa according to an example embodiment of the inventive concepts. Referring to FIG. 22, a memory block BLKa may include a plurality of cell strings CS11 to CS21 and CS12 to CS22. The plurality of cell strings CS11 to CS21 and CS12 to CS22 may be arranged along a row direction and a column direction and may form rows and columns.

For example, the cell strings CS11 and CS12 arranged along the row direction may form a first row, and the cell strings CS21 and CS22 arranged along the row direction may form a second row. The cell strings CS11 and CS21 arranged along the column direction may form a first column, and the cell strings CS12 and CS22 arranged along the column direction may form a second column.

Each cell string may contain a plurality of cell transistors. The cell transistors may include ground selection transistors GSTa and GSTb, memory cells MC1 through MC6, and string selection transistors SSTa and SSTb. The ground selection transistors GSTa and GSTb, memory cells MC1 through MC6, and string selection transistors SSTa and SSTb of each cell string are stacked in a height direction perpendicular to a plane (e.g., a plane on a substrate of the memory block BLKa) on which the cell strings CS11 through CS21 and CS12 through CS22 are arranged along rows and columns.

Each cell transistor may be formed of a charge trap type cell transistor of which the threshold voltage varies with the amount of charge trapped in its insulation layer.

Lowermost ground selection transistors GSTa may be connected in common to a common source line CSL.

Control gates of the ground selection transistors GSTa and GSTb in the cell strings CS11 to CS21 and CS12 to CS22 may be connected in common to ground selection lines GSLa and GSLb.

In example embodiments, ground selection transistors with the same height (or, order) may be connected to the same ground selection line, and ground selection transistors with different heights (or, orders) may be connected to different ground selection lines. For example, the ground selection transistors GSTa with a first height may be connected in common to a first ground selection line, and the ground selection transistors GSTb with a second height may be connected in common to a second ground selection line.

Connected in common to a word line are memory cells that are placed at the same height (or, order) from the substrate (or, the ground selection transistors GST). Connected to different word lines WL1 through WL6 are memory cells that are placed at different heights (or, orders). For example, the memory cells MC1 may be connected in common to the word line WL1, the memory cells MC2 may be connected in common to the word line WL2, and the memory cells MC3 may be connected in common to the word line WL3. The memory cells MC4 may be re connected in common to the word line WL4, the memory cells MC5 may be connected in common to the word line WL5, and the memory cells MC6 may be connected in common to the word line WL6.

In first string selection transistors SSTa, having the same height (or, order), of the cell strings CS11 to CS21 and CS12 to CS22, the first string selection transistors SSTa in different rows may be connected to different string selection lines SSL1a and SSL2a. For example, the first string selection transistors SSTa of the cell strings CS11 and CS12 may be connected in common to the string selection line SSL1a, and the first string selection transistors SSTa of the cell strings CS21 and CS22 may be connected in common to the string selection line SSL2a.

In second string selection transistors SSTb, having the same height (or, order), of the cell strings CS11 to CS21 and CS12 to CS22, the second string selection transistors SSTb in different rows may be connected to the different string selection lines SSL1b and SSL2b. For example, the second string selection transistors SSTb of the cell strings CS11 and CS12 may be connected in common to the string selection line SSL1b, and the second string selection transistors SSTb of the cell strings CS21 and CS22 may be connected in common to the string selection line SSL2b.

That is, cell strings in different rows may be connected to different string selection lines. String selection transistors, having the same height (or, order), of cell strings in the same row may be connected to the same string selection line. String selection transistors, having different heights (or, orders), of cell strings in the same row may be connected to different string selection lines.

In example embodiments, string selection transistors of cell strings in the same row may be connected in common to a string selection line. For example, string selection transistors SSTa and SSTb of cell strings CS11 and CS12 in the first row may be connected in common to a string selection line, and string selection transistors SSTa and SSTb of cell strings CS21 and CS22 in the second row may be connected in common to a string selection line.

Columns of the cell strings CS11 to CS21 and CS12 to CS22 may be connected to different bit lines BL1 and BL2, respectively. For example, string selection transistors SSTb of the cell strings CS11 and CS21 in the first column may be connected in common to the bit line BL1, and string selection transistors SSTb of the cell strings CS12 and CS22 in the second column may be connected in common to the bit line BL2.

The cell strings CS11 and CS12 may form a first plane, and the cell strings CS21 and CS22 may form a second plane.

In the memory block BLKa, memory cells in each plane having the same height may form a physical page. The physical page may be a write/read unit of memory cells MC1 to MC6. A plane of the memory block BLKa may be selected, for example, by string selection lines SSL1a, SSL1b, SSL2a, and SSL2b. Connected to the bit lines BL1 and BL2 are cell strings CS11 and CS12 of the first plane when a turn-on voltage is applied to the string selection lines SSL1a and SSL1b and a turn-off voltage is supplied to the string selection lines SSL2a and SSL2b. That is, the first plane is selected. Connected to the bit lines BL1 and BL2 are cell strings CS21 and CS22 of the second plane when a turn-on voltage is applied to the string selection lines SSL2a and SSL2b and a turn-off voltage is supplied to the string selection lines SSL1a and SSL1b. That is, the second plane is selected. In a selected plane, a row of memory cells may be selected by word lines WL1 to WL6. A read or a write operation may be performed with respect to the selected row.

An erase operation on the memory block BLKa may be performed by the block or by the sub block. All of memory cells of a memory block BLKa may be erased according to an erase request (e.g., an erase request from an external memory controller) when the erase operation is performed by the memory block. When the erase operation is performed by the sub block, a part of memory cells of the memory block BLKa may be erased, and the rest thereof may be erase-inhibited. A low voltage (e.g., a ground voltage or a low voltage having a level similar to that of the ground voltage) may be supplied to a word line connected to memory cells to be erased, and a word line connected to memory cells to be erase-inhibited may be floated.

The memory block BLKa shown in FIG. 22 is exemplary. However, the scope and spirit of the inventive concepts may not be limited thereto. For example, the number of rows of cell strings may increase or decrease. If the number of rows of cell strings is changed, the number of string or ground selection lines and the number of cell strings connected to a bit line may also be changed.

The number of columns of cell strings may increase or decrease. If the number of columns of cell strings is changed, the number of bit lines connected to columns of cell strings and the number of cell strings connected to a string selection line may also be changed.

A height of the cell strings may increase or decrease. For example, the number of ground selection transistors, memory cells, or string selection transistors that are stacked in each cell string may increase or decrease.

In example embodiments, memory cells MC in a physical page may correspond to at least three logical pages. For example, k bits (k being an integer of 2 or more) may be programmed at a memory cell MC. In memory cells MC in one physical page, k bits programmed at memory cells MC may form k logical pages.

In an example embodiment of the present inventive concepts, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an example embodiment of the present inventive concepts, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 23:
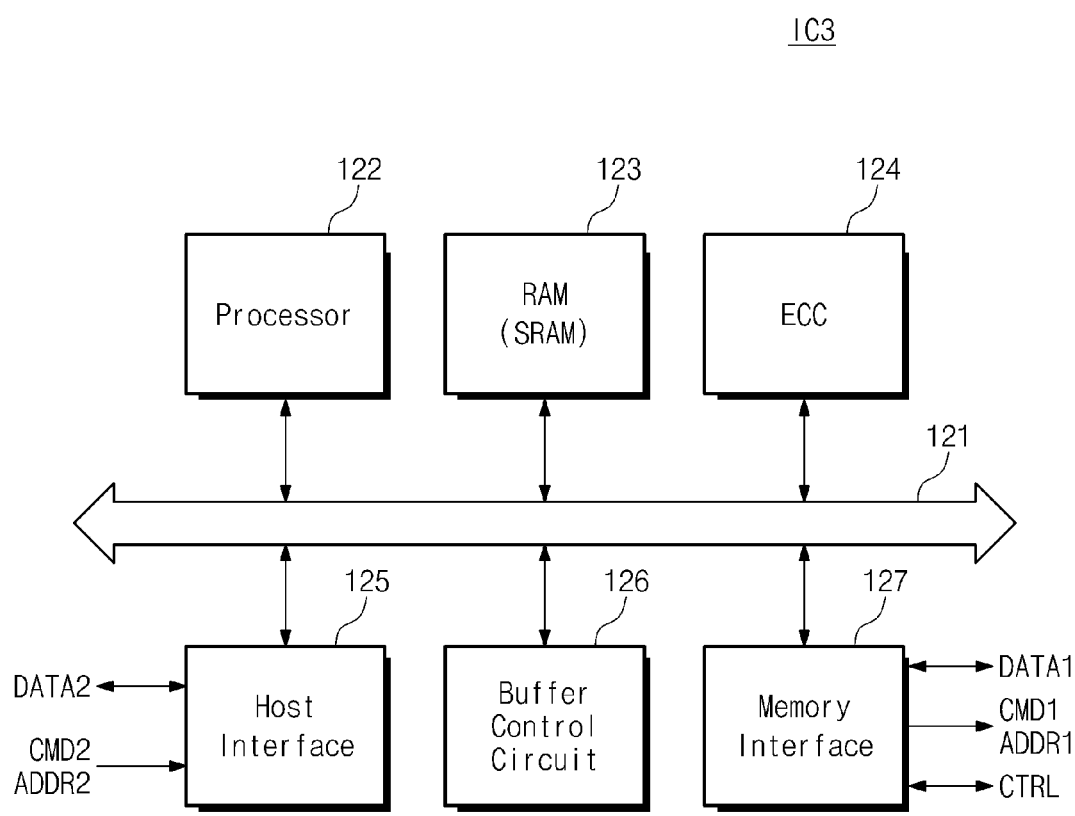
FIG. 23 is a block diagram schematically illustrating a third integrated circuit according to an example embodiment of the inventive concepts.

FIG. 23 is a block diagram schematically illustrating a third integrated circuit IC3 according to an example embodiment of the inventive concepts. Referring to FIG. 23, a third integrated circuit IC3 may contain a bus 121, a processor 122, a RAM 123, an ECC block 124, a host interface 125, a buffer control circuit 126, and a memory interface 127.

The bus 121 may be configured to provide a channel among components of the third integrated circuit IC3.

The processor 122 may control an overall operation of the third integrated circuit IC3 and may execute a logical operation. The processor 122 may communicate with an external host device through the host interface 125. The processor 122 may store, in the RAM 123, a second command CMD2 or a second address ADDR2 received through the host interface 125. The processor 122 may produce a first command CMD1 and a first address ADDR1 according to the second command CMD2 or the second address ADDR2 stored in the RAM 123, and may output the first command CMD1 and the first address ADDR1 through the memory interface 127.

The processor 122 may output the second data DATA2 received from the host interface 125 through the buffer control circuit 126 or may store it in the RAM 123. The processor 122 may output, through the memory interface 127, data stored in the RAM 123 or data received through the buffer control circuit 126. The processor 122 may store the first data DATA1 received through the memory interface 127 in the RAM 123 or may output it through the buffer control circuit 126. Under a control of the processor 122, data stored in the RAM 123 or data received through the buffer control circuit 126 may be output through the host interface 125 as the second data DATA2 or may be output through the memory interface 127 as the first data DATA1.

The RAM 123 may be used as a working memory, a cache memory, or a buffer memory of the processor 122. The RAM 123 may store codes or instructions that the processor 122 will execute. The RAM 123 may store data processed by the processor 122. The RAM 123 may include a static RAM (SRAM).

The ECC block 124 performs an error correction operation. The ECC block 124 generates parity for error correction, based on first data DATA1 to be output to the memory interface 127 or second data DATA2 received from the host interface 125. The first data DATA1 and parity may be output through the memory interface 127. The ECC block 124 corrects an error of first data DATA1 using the first data DATA1 and parity that are received through the memory interface 127. The ECC block 124 may be implemented as a component of the memory interface 127.

The host interface 125 may communicate with the external host device 100 according to a control of the processor 122. The host interface 125 may receive the second command CMD2 and the second address ADDR2 from the external host device and may exchange the second data DATA2 with the external host device.

The host interface 125 may communicate using at least one of the following communication manners: universal serial bus (USB), serial AT attachment (SATA), high speed interchip (HSIC), small computer system interface (SCSI), Firewire, peripheral component interconnection (PCI), PCIe (PCI express), nonvolatile memory express (NVMe), universal flash storage (UFS), secure digital (SD), multimedia card (MMC), and embedded MMC (eMMC).

The buffer control circuit 126 may be configured to control a fourth integrated circuit IC4 according to a control of the processor 122. The buffer control circuit 126 may write data at the fourth integrated circuit IC4 and may read data therefrom.

The memory interface 127 may be configured to communicate with a second integrated circuit IC2 according to a control of the processor 122. The memory interface 127 may send a first command CMD1 and a first address ADDR1 to the second integrated circuit IC2 and may exchange first data DATA1 and a control signal CTRL with the second integrated circuit IC2.

In example embodiments, in the case where the third integrated circuit IC3 is not connected to the fourth integrated circuit IC4, the third integrated circuit IC3 may not include the buffer controller circuit 126. A function of the fourth integrated circuit IC4 may be performed by an internal RAM 123 of the first or fourth integrated circuit IC1 or IC4.

In example embodiments, the processor 122 may control the third integrated circuit IC3 using codes. The processor 122 may load codes from a nonvolatile memory (e.g., a read only memory) in the third integrated circuit IC3. In other example embodiments, the processor 122 may load codes received from the memory interface 127.

In example embodiments, the bus 121 of the third integrated circuit IC3 may be classified into a control bus and a data bus. The data bus may transfer data in the third integrated circuit IC3, and the control bus may transfer a command and an address in the third integrated circuit IC3. The data bus and the control bus may independent of each other so as to prevent interference between the data and control buses and so as not to affect each other. The data bus may be connected to the ECC block 124, the host interface 125, the buffer controller circuit 126, and the memory interface 127. The control bus may be connected to the processor 122, the RAM 123, the host interface 125, the buffer controller circuit 126, and the memory interface 127.

According to an example embodiment of the inventive concepts, an integrated circuit may be tested with a non-volatile memory and the integrated circuit coupled. Accordingly, an integrated circuit and a storage device including the same, which are capable of supporting an improved test method, may be provided.

While the inventive concepts have been described with reference to some example embodiments, it will be apparent to those skilled in the art that various changes and modifications may be made without departing from the spirit and scope of the inventive concepts. Therefore, it should be understood that the above example embodiments are not limiting, but illustrative.

What is claimed is:

1. An integrated circuit comprising:
first pads and second pads;
a first receiver circuit and a first driver circuit respectively connected to the first pads;
a second receiver circuit and a second driver circuit respectively connected to the second pads; and
a first loopback circuit having a first input terminal electrically connected to the first receiver circuit, a first output terminal electrically connected to the first driver circuit, a second output terminal electrically connected to the second driver circuit, and a second input terminal electrically connected to the second receiver circuit,
wherein the first loopback circuit further has a first path connecting the first input terminal to the second output terminal, a second path connecting the second input terminal to the first output terminal, and a third path connecting the first input terminal and the first output terminal,
wherein at a normal mode, the first loopback circuit is configured to electrically connect the first input terminal to the second output terminal and to electrically connect the second input terminal to the first output terminal by activating the first and second paths and deactivating the third path, and
wherein at a test mode, the first loopback circuit is configured to electrically connect the first input terminal to the first output terminal by activating the third path and deactivating the first and second paths.

2. The integrated circuit of claim 1, further comprising:
an internal circuit connected between the second output terminal and the second driver circuit and between the second input terminal and the second receiver circuit; and
a second loopback circuit having a third input terminal electrically connected to the second output terminal through the internal circuit, a third output terminal electrically connected to the second input terminal through the internal circuit, a fourth output terminal electrically connected to the second driver circuit, and a fourth input terminal electrically connected to the second receiver circuit,
wherein at the normal mode, the second loopback circuit is configured to electrically connect the third input terminal to the fourth output terminal and electrically connect the third output terminal to the fourth input terminal, and wherein at the test mode, the second loopback circuit is configured to electrically connect the third input terminal to the third output terminal.

3. The integrated circuit of claim 1, further comprising: a second loopback circuit configured to,
   inactivate, at the normal mode, one of the second driver circuit and the second receiver circuit, when the other one of the second driver circuit and the second receiver circuit is activated, and
   activate, at the test mode, both the second driver circuit and the second receiver circuit.

4. The integrated circuit of claim 1, further comprising:
   third pads and fourth pads;
   a third driver circuit and a third receiver circuit respectively connected to the third pads;
   a fourth driver circuit and a fourth receiver circuit respectively connected to the fourth pads; and
   a second loopback circuit having a third input terminal electrically connected to the third receiver circuit, a third output terminal electrically connected to the third driver circuit, a fourth output terminal electrically connected to the fourth driver circuit, and a fourth input terminal electrically connected to the fourth receiver circuit.

5. The integrated circuit of claim 4, wherein at the normal mode, the second loopback circuit is configured to electrically connect the third input terminal to the fourth output terminal and to electrically connect the third output terminal to the fourth input terminal, and
   wherein at the test mode, the second loopback circuit is configured to electrically connect the third input terminal to the third output terminal.

6. The integrated circuit of claim 4, wherein at the normal mode, the second loopback circuit is configured to electrically connect the third input terminal to the fourth output terminal and electrically connect the third output terminal to the fourth input terminal,
   wherein at the test mode, the first or second loopback circuits are configured to electrically connect one of the third input terminal and the first input terminal to the first output terminal.

7. The integrated circuit of claim 4, further comprising:
   a third loopback circuit having a fifth input terminal electrically connected to the second output terminal, a fifth output terminal electrically connected to the second input terminal, a sixth output terminal electrically connected to the second driver circuit, and a sixth input terminal electrically connected to the second receiver circuit,
   wherein at the normal mode, the second loopback circuit is configured to electrically connect the third input terminal to the fourth output terminal and electrically connect the third output terminal to the fourth input terminal,
   wherein at the normal mode, the third loopback circuit is configured to electrically connect the fifth input terminal to the sixth output terminal and electrically connect the fifth output terminal to the sixth input terminal,
   wherein at the test mode, the third loopback circuit is configured to electrically connect the third input terminal to the fifth output terminal through the second loopback circuit.

8. The integrated circuit of claim 7, wherein at the test mode, the second loopback circuit is configured to electrically connect the fifth input terminal to the third output terminal through the third loopback circuit.

9. The integrated circuit of claim 1, further comprising:
   a third pad and a fourth pad;
   a third receiver circuit connected to the third pad;
   a third driver circuit connected to the fourth pad; and
   a second loopback circuit having a third input terminal electrically connected to the third receiver circuit and to a third output terminal electrically connected to the third driver circuit,
   wherein at the normal mode, the second loopback circuit is configured to electrically connect the third input terminal and the third output terminal.

10. The integrated circuit of claim 9, wherein at the test mode, the first or second loopback circuits are configured to electrically connect one of the first input terminal and the third input terminal to the first output terminal.

11. The integrated circuit of claim 9, further comprising:
    a third loopback circuit having a fourth input terminal electrically connected to the second output terminal, a fourth output terminal electrically connected to the second input terminal, a fifth output terminal electrically connected to the second driver circuit, and a fifth input terminal electrically connected to the second receiver circuit, and
    wherein at the test mode, the second loopback circuit is configured to electrically connect the third input terminal to the third loopback circuit.

12. The integrated circuit of claim 11, wherein at the normal mode, the third loopback circuit is configured to electrically connect the fourth input terminal and the fifth output terminal and to electrically connect the fourth output terminal and the fifth input terminal, and
    wherein at the test mode, the third loopback circuit is configured to electrically connect the second input terminal to the second loopback circuit through the fourth output terminal.

13. A storage device comprising:
    a plurality of nonvolatile memories;
    a memory controller configured to control the plurality of nonvolatile memories; and
    an integrated circuit connected between the plurality of nonvolatile memories and the memory controller and configured to adjust timing of a signal exchanged between the plurality of nonvolatile memories and the memory controller,
    wherein the integrated circuit comprises a loopback circuit having a first path connecting a first input terminal connected to the memory controller to a second output terminal connected to the plurality of nonvolatile memories, a second path connecting a second input terminal connected to the plurality of nonvolatile memories to a first output terminal connected to the memory controller, and a third path connecting the first input terminal and the first output terminal,
    wherein at a normal mode, the integrated circuit is configured to transfer a signal received from the memory controller to the plurality of nonvolatile memories through the first path, and
    wherein at a test mode, the integrated circuit is configured to feed at least a portion of a signal received from the memory controller back to the memory controller through the third path.

14. The storage device of claim 13, wherein each of the plurality of nonvolatile memories comprises a three-dimensional memory array of a plurality of memory cells, each of which includes a charge trap layer.

15. The storage device of claim 13, wherein the integrated circuit comprises:

a loopback circuit configured to control a signal path such that (i) a data signal received from the memory controller through a first data pad of the integrated circuit at the normal mode is output to the plurality of nonvolatile memories through a second data pad of the integrated circuit and or (ii) a data signal received through the first data pad at the test mode is fed back to the memory controller through the first data pad.

16. A solid state drive comprising:
one or more groups of nonvolatile memories; and
one or more interface circuits connected to the one or more groups of nonvolatile memories, respectively;
wherein the one or more interface circuits are configured to arbitrate a communication between the one or more groups of nonvolatile memories and an external device,
wherein each of the one or more interface circuits includes at least one loopback circuit,
the loopback circuit has a first path connecting a first input terminal connected to the external device to a second output terminal connected to the one or more groups of nonvolatile memories, a second path connecting a second input terminal connected to the one or more groups of nonvolatile memories to a first output terminal connected to the external device, and a third path connecting the first input terminal and the first output terminal, and the at least one loopback circuit is configured to be active during a normal mode and be inactive during a test mode such that
during the normal mode, a corresponding one of the one or more interface circuits is configured to arbitrate the communication between a corresponding one of the one or more groups of nonvolatile memories and the external device through the first and second paths, and
during the test mode, the loopback circuit is configured to feed a signal received from the external device back to the external device through the third path.

17. The solid state drive of claim 16, wherein the loopback circuit is configured to enter the normal mode or the test mode according to a control signal or command from the external device.

18. The solid state drive of claim 16, wherein each of the one or more interface circuits is further configured to adjust synchronization of signals or clocks exchanged between a corresponding one of the one or more groups of nonvolatile memories and the external device.

19. The solid state drive of claim 16, wherein the external device includes a memory controller.

* * * * *